(12) United States Patent
Milbar

(10) Patent No.: US 9,842,048 B2
(45) Date of Patent: Dec. 12, 2017

(54) SYSTEMS, METHODS, AND COMPUTER READABLE MEDIA FOR DIGITAL RADIO BROADCAST RECEIVER MEMORY AND POWER REDUCTION

(71) Applicant: iBiquity Digital Corporation, Columbia, MD (US)

(72) Inventor: Marek Milbar, Huntingdon Valley, PA (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 14/939,863

(22) Filed: Nov. 12, 2015

(65) Prior Publication Data
US 2016/0140037 A1 May 19, 2016

Related U.S. Application Data

(62) Division of application No. 12/805,433, filed on Jul. 30, 2010, now Pat. No. 9,203,668.
(Continued)

(51) Int. Cl.
*H04L 27/06* (2006.01)
*G06F 12/06* (2006.01)
(Continued)

(52) U.S. Cl.
CPC .... *G06F 12/0607* (2013.01); *H03M 13/2707* (2013.01); *H03M 13/2785* (2013.01);
(Continued)

(58) Field of Classification Search
CPC ............. H04L 27/2601; H04L 27/2649; H04L 1/0071; G06F 12/0607; H03M 13/2707; H03M 13/2785; H04B 1/06
(Continued)

(56) References Cited

U.S. PATENT DOCUMENTS 6,014,761 A * 1/2000 Lachish ................ H04L 1/0043
714/702
6,588,015 B1 * 7/2003 Eyer .................... H04H 20/106
704/500
(Continued)

OTHER PUBLICATIONS

National Radio Systems Committee (NRSC), NRSC-5-B, "In-band/on-channel Digital Radio Broadcasting Standard," Apr. 2008.
(Continued)

*Primary Examiner* — Leila Malek
(74) *Attorney, Agent, or Firm* — Schwegman Lundberg & Woessner, P.A.

(57) ABSTRACT

A method of block deinterleaving data received at a digital radio broadcast receiver is described. The method includes providing a block of memory having a n×k addresses, wherein the block comprises a single table, receiving a digital radio broadcast signal at the receiver, and demodulating the digital radio broadcast signal into a plurality of interleaved data units. For at least one series of n×k data units a pointer step size is determined, and for each data unit in the series, an address in the block is calculated based on the pointer step size, and an output data unit is read from the block at the address, such that said output data units represent block deinterleaved data units. An input data unit from the plurality of interleaved data units is then written to the block at the address. Associated systems and computer readable storage media are presented.

27 Claims, 25 Drawing Sheets

Related U.S. Application Data

(60) Provisional application No. 61/213,935, filed on Jul. 30, 2009, provisional application No. 61/213,942, filed on Jul. 31, 2009.

(51) Int. Cl.

| | | |
|---|---|---|
| *H03M 13/27* | (2006.01) | |
| *H03M 13/00* | (2006.01) | |
| *H04L 27/26* | (2006.01) | |
| *H04B 1/06* | (2006.01) | |
| *H04W 52/02* | (2009.01) | |

(52) U.S. Cl.
CPC .......... *H03M 13/6569* (2013.01); *H04B 1/06* (2013.01); *H04L 27/2601* (2013.01); *H04L 27/2649* (2013.01); *H04W 52/0206* (2013.01); *G06F 2212/1028* (2013.01); *G06F 2212/154* (2013.01); *G06F 2212/174* (2013.01); *H04H 2201/18* (2013.01); *Y02B 60/50* (2013.01)

(58) Field of Classification Search
USPC .................................. 375/316, 340; 714/702
See application file for complete search history.

(56) References Cited

U.S. PATENT DOCUMENTS

| | | | | |
|---|---|---|---|---|
| 7,352,817 | B2 | 4/2008 | Milbar | |
| 7,512,175 | B2 | 3/2009 | Kroeger | |
| 8,601,457 | B1* | 12/2013 | Han | G06F 11/3608 717/154 |
| 9,203,668 | B2 | 12/2015 | Milbar | |
| 2004/0162931 | A1* | 8/2004 | Hwang | H03M 13/27 711/5 |
| 2005/0063421 | A1 | 3/2005 | Wan et al. | |
| 2008/0256417 | A1 | 10/2008 | Andersson | |
| 2008/0270714 | A1* | 10/2008 | Van Den Bosch | H03M 13/2707 711/157 |
| 2009/0248997 | A1* | 10/2009 | Ben-Ari | H03M 13/2717 711/157 |

OTHER PUBLICATIONS

International Search Report dated Sep. 22, 2010 from corresponding International Application No. PCT/US2010/043820.
Written Opinion of the International Searching Authority dated Sep. 22, 2010 from corresponding International Application No. PCT/US2010/043820.
"U.S. Appl. No. 12/805,433, Advisory Action dated Sep. 18, 2013", 3 pgs.
"U.S. Appl. No. 12/805,433, Advisory Action dated Sep. 29, 2014", 6 pgs.
"U.S. Appl. No. 12/805,433, Appeal Brief filed Jan. 12, 2015", 18 pgs.
"U.S. Appl. No. 12/805,433, Applicant's Summary of Examiner Interview filed Jan. 3, 2014", 1 pg.
"U.S. Appl. No. 12/805,433, Applicant's Summary of Examiner Interview filed Aug. 31, 2015", 1 pg.
"U.S. Appl. No. 12/805,433, Decision on Pre-Appeal Brief Request dated Nov. 10, 2014", 2 pgs.
"U.S. Appl. No. 12/805,433, Examiner's Answer to Appeal Brief dated May 6, 2015", 15 pgs.
"U.S. Appl. No. 12/805,433, Final Office Action dated Jun. 5, 2013", 10 pgs.
"U.S. Appl. No. 12/805,433, Final Office Action dated Jun. 20, 2014", 9 pgs.
"U.S. Appl. No. 12/805,433, Non Final Office Action dated Oct. 25, 2012", 9 pgs.
"U.S. Appl. No. 12/805,433, Non Final Office Action dated Dec. 3, 2013", 9 pgs.
"U.S. Appl. No. 12/805,433, Notice of Allowance dated Jul. 29, 2015", 11 pgs.
"U.S. Appl. No. 12/805,433, Pre-Appeal Brief Request filed Oct. 12, 2014", 5 pgs.
"U.S. Appl. No. 12/805,433, Response filed Mar. 25, 2013 to Non Final Office Action dated Oct. 25, 2012", 6 pgs.
"U.S. Appl. No. 12/805,433, Response filed Apr. 3, 2014 to Non Final Office Action dated Dec. 3, 2013", 7 pgs.
"U.S. Appl. No. 12/805,433, Response filed Jul. 6, 2015 to Examiner's Answer to Appeal Brief dated May 6, 2015", 7 pgs.
"U.S. Appl. No. 12/805,433, Response filed Aug. 30, 2013 to Final Office Action dated Jun. 5, 2013", 8 pgs.
"U.S. Appl. No. 12/805,433, Response filed Sep. 10, 2014 to Final Office Action dated Jun. 10, 2014", 5 pgs.
"U.S. Appl. No. 12/805,433, Response flied Sep. 18, 2012 to Restriction Requirement dated Jul. 18, 2012", 6 pgs.
"U.S. Appl. No. 12/805,433, Restriction Requirement dated Jul. 18, 2012", 6 pgs.
"Canadian Application Serial No. 2,766,469, Office Action dated Jun. 28, 2016", 4 pgs.
"Canadian Application Serial No. 2,766,469, Response filed Dec. 15, 2016 to Office Action dated Jun. 28, 2016", 13 pgs.
"International Application Serial No. PCT/US2010/043820, International Preliminary Report on Patentability dated Feb. 9, 2012", 8 pgs.
"Mexican Application Serial No. MX/a/2012/000831, Office Action dated Mar. 17, 2015", 3 pgs.
"Mexican Application Serial No. MX/a/2012/000831, Office Action dated Jun. 2, 2014", 3 pgs.
"Mexican Application Serial No. MX/a/2012/000831, Office Action dated Oct. 30, 2014", 3 pgs.
"Mexican Application Serial No. MX/a/2012/000831, Response filed Mar. 5, 2015 to Office Action dated Oct. 30, 2014", 8 pgs.
"Mexican Application Serial No. MX/a/2012/000831, Response filed Jul. 23, 2015 to Office Action dated Mar. 17, 2015", 11 pgs.
"Mexican Application Serial No. MX/a/2012/000831, Response filed Oct. 27, 2014 to Office Action dated Jun. 2, 2014", 3 pgs.
"Canadian Application Serial No. 2,766,469, Office Action dated Apr. 19, 2017", 3 pgs.

\* cited by examiner

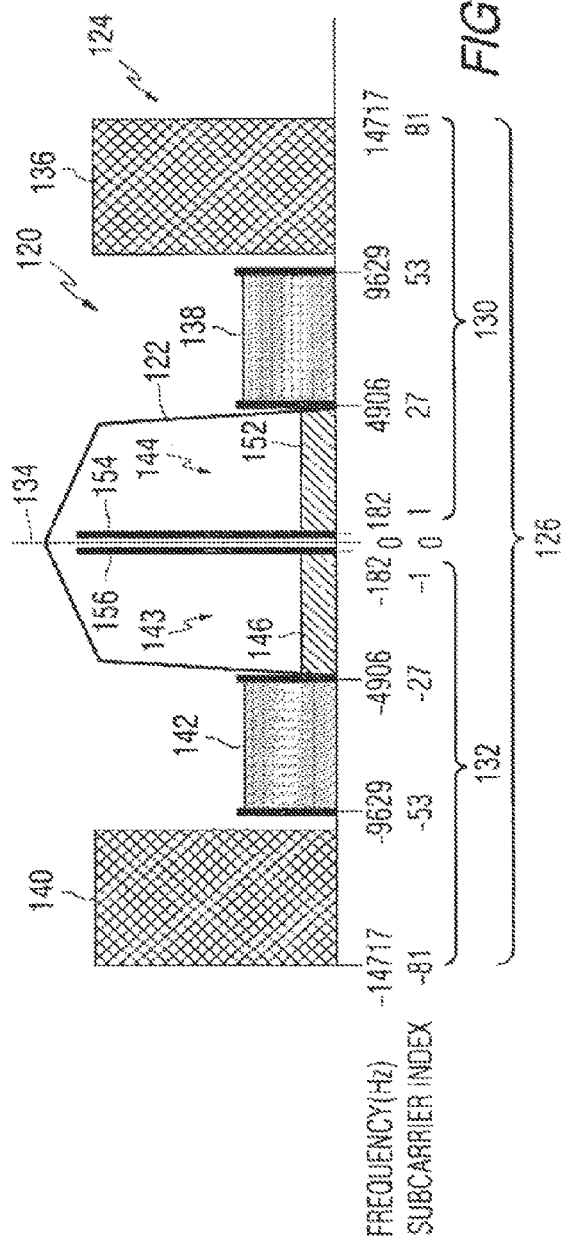
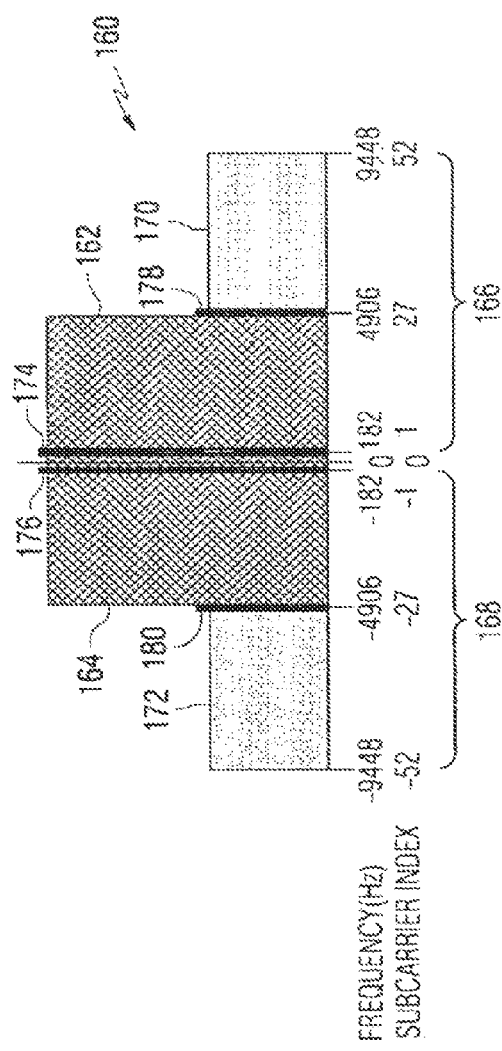

FIG. 19

| SINGLE RECEIVER DEINTERLEAVER TABLE | | | | | | | | | | |
|---|---|---|---|---|---|---|---|---|---|---|
| 1 | 46 | 15 | 60 | 29 | 74 | 43 |
| 12 | 57 | 26 | 71 | 40 | 9 | 54 |
| 23 | 68 | 37 | 6 | 51 | 20 | 65 |
| 34 | 3 | 48 | 17 | 62 | 31 | 76 |
| 45 | 14 | 59 | 28 | 73 | 42 | 11 |
| 56 | 25 | 70 | 39 | 8 | 53 | 22 |
| 67 | 36 | 5 | 50 | 19 | 64 | 33 |
| 2 | 47 | 16 | 61 | 30 | 75 | X |
| 13 | 58 | 27 | 72 | 41 | 10 | X |
| 24 | 69 | 38 | 7 | 52 | 21 | X |
| 35 | 4 | 49 | 18 | 63 | 32 | X |

WRITE TABLE →
READ TABLE →

*FIG. 20*

| | | | | | | | | | | |
|---|---|---|---|---|---|---|---|---|---|---|
| 78 | 117 | 80 | 60 | 82 | 74 | 84 |
| 123 | 57 | 125 | 71 | 127 | 86 | 54 |
| 92 | 68 | 94 | 133 | 96 | 135 | 65 |
| 137 | 100 | 139 | 102 | 62 | 104 | 76 |
| 106 | 145 | 59 | 147 | 73 | 149 | 112 |
| 56 | 114 | 70 | 116 | 79 | 118 | 81 |
| 67 | 83 | 122 | 85 | 124 | 64 | 126 |
| 89 | 128 | 91 | 61 | 93 | 75 | 95 |
| 134 | 58 | 136 | 72 | 138 | 101 | 55 |
| 103 | 69 | 105 | 144 | 107 | 146 | 66 |
| 148 | 111 | 150 | 113 | 63 | 115 | 77 |
SINGLE RECEIVER DEINTERLEAVER TABLE
WRITE TABLE →
READ TABLE →
FIG. 21

FIG. 22a

SINGLE TABLE DEINTERLEAVER READ/WRITE DATA UNITS

| READ  | 24  | 25  | 26  | 27  | 28  | 29  | 30  | 31  | 32  | 33  | 34  | 35  | 36  | 37  | 38  | 39  | 40  | 41  | 42  | 43  |
|-------|-----|-----|-----|-----|-----|-----|-----|-----|-----|-----|-----|-----|-----|-----|-----|-----|-----|-----|-----|-----|
| WRITE | 103 | 114 | 125 | 136 | 147 | 82  | 93  | 104 | 115 | 126 | 137 | 148 | 83  | 94  | 105 | 116 | 127 | 138 | 149 | 84  |

| READ  | 44 | 45  | 46  | 47  | 48  | 49  | 50 | 51 | 52  | 53  | 54  | 55  | 56  | 57 | 58 | 59  | 60  | 61  | 62  | 63  |
|-------|----|-----|-----|-----|-----|-----|----|----|-----|-----|-----|-----|-----|----|----|-----|-----|-----|-----|-----|
| WRITE | 95 | 106 | 117 | 128 | 139 | 150 | 85 | 96 | 107 | 118 | 129 | 140 | 151 | 86 | 97 | 108 | 119 | 130 | 141 | 152 |

| READ  | 64 | 65  | 66  | 67  | 68  | 69  | 70  | 71 | 72  | 73  | 74  | 75  | 76  | 77  | 78  | 79  | 80  | 81  | 82  | 83  |
|-------|----|-----|-----|-----|-----|-----|-----|----|-----|-----|-----|-----|-----|-----|-----|-----|-----|-----|-----|-----|
| WRITE | 87 | 98  | 109 | 120 | 131 | 142 | 153 | 99 | 110 | 121 | 132 | 143 | 154 | 155 | 166 | 177 | 188 | 199 | 210 |

| READ  | 84  | 85  | 86  | 87  | 88  | 89  | 90  |
|-------|-----|-----|-----|-----|-----|-----|-----|
| WRITE | 221 | 156 | 167 | 178 | 189 | 200 | 211 |

FIG. 22b

SYSTEMS, METHODS, AND COMPUTER READABLE MEDIA FOR DIGITAL RADIO BROADCAST RECEIVER MEMORY AND POWER REDUCTION

This application is a divisional of U.S. patent application Ser. No. 12/805,433 filed Jul. 30, 2010, entitled "Systems, Methods, and Computer Readable Media for Digital Radio Broadcast Receiver Memory and Power Reduction," which claims the benefit of U.S. Provisional Patent Application No. 61/213,935 filed Jul. 30, 2009 and U.S. Provisional Patent Application No. 61/213,942 filed Jul. 31, 2009, the entire contents of each of which are incorporated herein by reference.

BACKGROUND

Field of the Disclosure

The present disclosure relates to reducing memory and power usage in digital radio broadcast receivers.

Background Information

Digital radio broadcasting technology delivers digital audio and data services to mobile, portable, and fixed receivers. One type of digital radio broadcasting, referred to as in-band on-channel (IBOC) digital audio broadcasting (DAB), uses terrestrial transmitters in the existing Medium Frequency (MF) and Very High Frequency (VHF) radio bands. HD Radio™ Technology, developed by iBiquity Digital Corporation, is one example of an IBOC implementation for digital radio broadcasting and reception.

IBOC digital radio broadcasting signals can be transmitted in a hybrid format including an analog modulated carrier in combination with a plurality of digitally modulated carriers or in an all-digital format wherein the analog modulated carrier is not used. Using the hybrid mode, broadcasters may continue to transmit analog AM and FM simultaneously with higher-quality and more robust digital signals, allowing themselves and their listeners to convert from analog-to-digital radio while maintaining their current frequency allocations.

One feature of digital transmission systems is the inherent ability to simultaneously transmit both digitized audio and data. Thus the technology also allows for wireless data services from AM and FM radio stations. The broadcast signals can include metadata, such as the artist, song title, or station call letters. Special messages about events, traffic, and weather can also be included. For example, traffic information, weather forecasts, news, and sports scores can all be scrolled across a radio receiver's display while the user listens to a radio station.

IBOC digital radio broadcasting technology can provide digital quality audio, superior to existing analog broadcasting formats. Because each IBOC digital radio broadcasting signal is transmitted within the spectral mask of an existing AM or FM channel allocation, it requires no new spectral allocations. IBOC digital radio broadcasting promotes economy of spectrum while enabling broadcasters to supply digital quality audio to the present base of listeners.

Multicasting, the ability to deliver several audio programs or services over one channel in the AM or FM spectrum, enables stations to broadcast multiple services and supplemental programs on any of the sub-channels of the main frequency. For example, multiple data services can include alternative music formats, local traffic, weather, news, and sports. The supplemental services and programs can be accessed in the same manner as the traditional station frequency using tuning or seeking functions. For example, if the analog modulated signal is centered at 94.1 MHz, the same broadcast in IBOC can include supplemental services 94.1-2, and 94.1-3. Highly specialized supplemental programming can be delivered to tightly targeted audiences, creating more opportunities for advertisers to integrate their brand with program content. As used herein, multicasting includes the transmission of one or more programs in a single digital radio broadcasting channel or on a single digital radio broadcasting signal. Multicast content can include a main program service (MPS), supplemental program services (SPS), program service data (PSD), and/or other broadcast data.

The National Radio Systems Committee, a standard-setting organization sponsored by the National Association of Broadcasters and the Consumer Electronics Association, adopted an IBOC standard, designated NRSC-5, in September 2005. NRSC-5 and its updates, the disclosure of which are incorporated herein by reference, set forth the requirements for broadcasting digital audio and ancillary data over AM and FM broadcast channels. The standard and its reference documents contain detailed explanations of the RF/transmission subsystem and the transport and service multiplex subsystems. Copies of the standard can be obtained from the NRSC at http://www.nrscstandards.org/SG.asp. iBiquity's HD Radio™ technology is an implementation of the NRSC-5 IBOC standard. Further information regarding HD Radio™ technology can be found at www.hdradio.com and www.ibiquity.com.

Other types of digital radio broadcasting systems include satellite systems such as Satellite Digital Audio Radio Service (SDARS, e.g., XM Radio, Sirius), Digital Audio Radio Service (DARS, e.g., WorldSpace), and terrestrial systems such as Digital Radio Mondiale (DRM), Eureka 147 (branded as DAB Digital Audio Broadcasting), DAB Version 2, and FMeXtra. As used herein, the phrase "digital radio broadcasting" encompasses digital audio broadcasting including in-band on-channel broadcasting, as well as other digital terrestrial broadcasting and satellite broadcasting.

Typical digital radio broadcast receiver implementations at the highest level of functionality require dynamic memory allocations in amounts that may be too large for cost and size optimization. Reducing the amount of required memory may typically be done, to a degree, without affecting functionality. However, such reduction may eventually lead to reduced performance, which may be reflected in slower receiver response and limited instantaneous information regarding services that are available but are not selected for current use. Further memory reduction may result in reduced receiver functionality, and may not be acceptable in some cases.

One particular operation that involves large amounts of receiver memory is deinterleaving. Block-based techniques of deinterleaving in digital radio receivers are processor intensive and typically require two full tables of addresses in memory. Thus, reducing the memory requirements for deinterleaving could result in significant memory and power reduction at the digital radio broadcast receiver.

In addition, typical receiver implementations employ complete processing of the physical layer (Layer 1), which is in excess of the actual content and bit rate of the data being rendered by the receiver. In the case of audio, the presence of more than one audio service can lead to deinterleaving and decoding audio services that a user does not hear, therefore wasting receiver processing resources and memory. In the case of data, data services may be delivered within any logical channel, each of which may contain several sub-channels. Therefore, when a receiver becomes aware of a data service, it may have to process numerous logical channels and sub-channels to render only one service of interest. Again, this additional processing is wasteful of receiver processing and memory resources.

The present inventor has found that digital radio broadcast receivers can be implemented with reduced memory and power requirements by improving the deinterleaving memory and operation's efficiency and/or minimizing other unnecessary operations.

SUMMARY

Embodiments of the present disclosure are directed to systems and methods that may satisfy these needs. According to exemplary embodiments, a processor-implemented method of block deinterleaving data received at a digital radio broadcast receiver is disclosed. The method includes providing a block of memory having n rows and k columns of addresses, wherein the block comprises a single table; receiving a digital radio broadcast signal at the digital radio broadcast receiver; demodulating the digital radio broadcast signal into a plurality of interleaved data units; for at least one series of n×k data units from the stream, determining a pointer step size; and for each data unit in the series, calculating an address in the block based on the pointer step size; reading an output data unit from the address; and writing an input data unit from the plurality of interleaved data units to the address, such that said output data units represent block deinterleaved data units.

According to further exemplary embodiments, a processor-implemented method of reducing power usage of a digital radio broadcast receiver is disclosed. The method includes receiving a digital radio broadcast signal at the digital radio broadcast receiver; demodulating the digital radio broadcast signal; mapping a set of services included in the demodulated signal; selecting one or more services from the mapped set of services; reading data and overhead packets associated with the selected services from a deinterleaver; and discarding data packets associated with services not selected.

A system comprising a processing system and a memory coupled to the processing system is described wherein the processing system is configured to carry out the above-described methods. Computer programming instructions adapted to cause a processing system to carry out the above-described methods may be embodied within a non-transitory computer readable storage medium.

BRIEF DESCRIPTION OF THE DRAWINGS

These and other features, aspects, and advantages of the present disclosure will become better understood with regard to the following description, appended claims, and accompanying drawings wherein:

FIG. 5 is a schematic representation of a hybrid AM IBOC waveform;

FIG. 6 is a schematic representation of an all-digital AM IBOC waveform;

FIG. 11 illustrates exemplary transmitter block interleaver tables (i.e., two tables) after filling 76 bits in accordance with certain embodiments;

FIG. 12 illustrates conventional receiver block deinterleaver tables (i.e., two tables) after receiving 76 bits;

FIG. 13 illustrates exemplary transmitter block interleaver tables (i.e., two tables) after filling 150 bits in accordance with certain embodiments;

FIG. 15 illustrates exemplary transmitter block interleaver tables (i.e., two tables) after filling 207 bits in accordance with certain embodiments;

FIG. 16 illustrates conventional receiver block deinterleaver tables (i.e., two tables) after receiving 207 bits;

FIG. 17 illustrates an exemplary stream of block interleaved data in accordance with certain embodiments;

FIG. 19 illustrates an exemplary receiver block deinterleaver single table after receiving 76 bits in accordance with certain embodiments;

FIG. 20 illustrates an exemplary receiver block deinterleaver single table after receiving 150 bits in accordance with certain embodiments;

FIG. 21 illustrates an exemplary receiver block deinterleaver single table after receiving 207 bits in accordance with certain embodiments;

FIGS. 22a and 22b illustrate exemplary single table block deinterleaver read and write data streams in accordance with certain embodiments;

DESCRIPTION

The present disclosure provides methods, systems, and processor readable media that may lead to reduced memory and power usage in a digital radio broadcast receiver. In certain embodiments the methods may involve the receiver design only.

FIGS. 1-10 and the accompanying description herein provide a general description of an exemplary IBOC system, exemplary broadcasting equipment structure and operation, and exemplary receiver structure and operation. FIGS. 11-24 and the accompanying description herein provide a detailed description of exemplary approaches for reducing memory and power usage in a digital radio broadcast receiver in accordance with exemplary embodiments of the present disclosure. Whereas aspects of the disclosure are presented in the context of an exemplary IBOC system, it should be understood that the present disclosure is not limited to IBOC systems and that the teachings herein are applicable to other forms of digital radio broadcasting as well.

As referred to herein, a service is any analog or digital medium for communicating content via radio frequency broadcast. For example, in an IBOC radio signal, the analog modulated signal, the digital main program service, and the digital supplemental program services could all be considered services. Other examples of services can include conditionally accessed programs (CAs), which are programs that require a specific access code and can be audio such as, for example, a broadcast of a game or a concert. Additional examples of services can include conditionally accessed (CA) data services, which require a specific access code and can be data such as, for example, a traffic update service, multimedia and other files, and service information guides (SIGs). A service identifier as referred to herein is a reference to a particular service. For example, if an analog modulated signal is centered at 94.1 MHz then a service identifier could refer to the radio frequency of 94.1 MHz. Additionally, the same broadcast in IBOC digital radio broadcasting can include a number of supplemental audio and data services and each could have its own service identifier.

Also, data units as referred to herein may be individual bits, nibbles, bytes, or any other unit of data.

Figure 1:
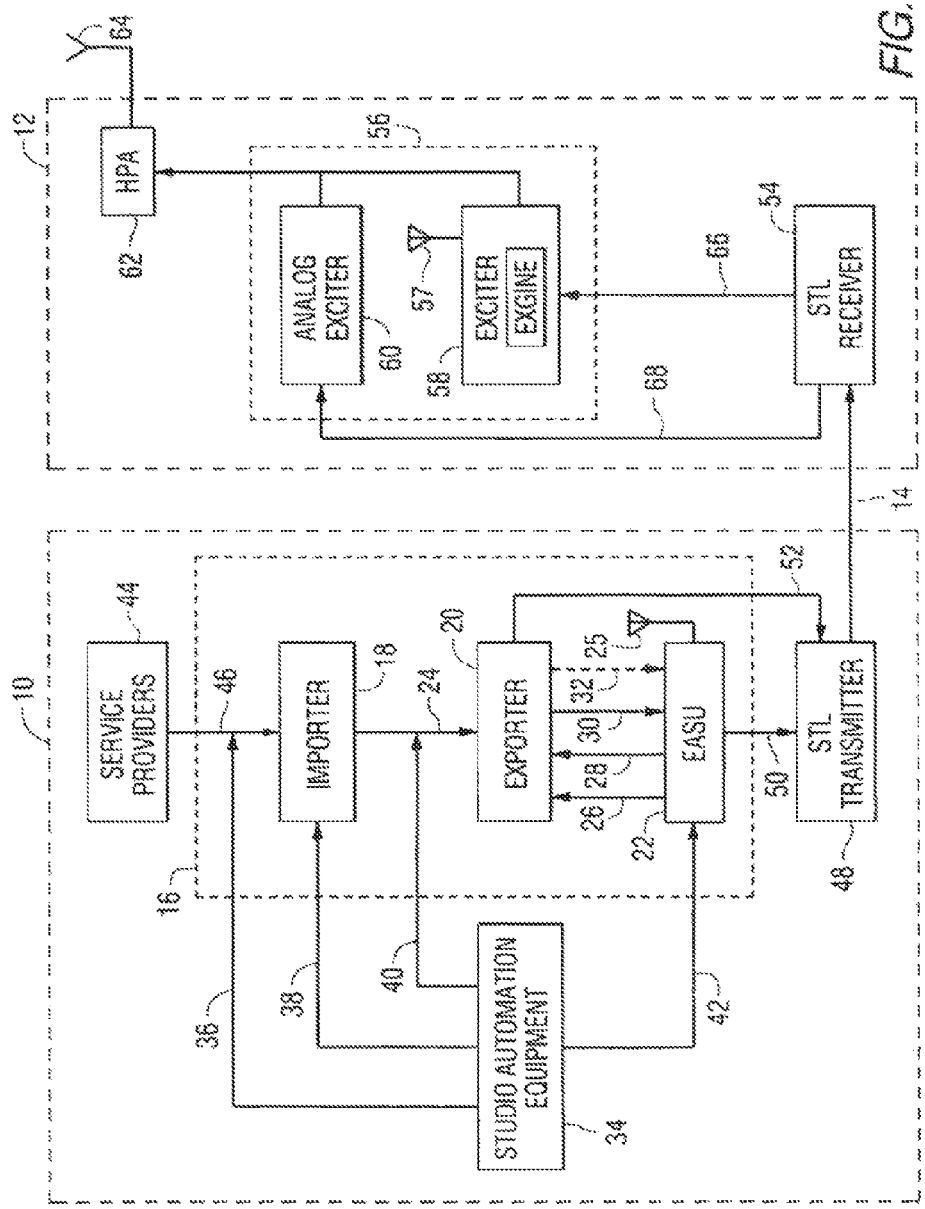
FIG. 1 illustrates a block diagram that provides an overview of a system in accordance with certain embodiments.

Referring to the drawings, FIG. 1 is a functional block diagram of the relevant components of a studio site 10, an FM transmitter site 12, and a studio transmitter link (STL) 14 that can be used to broadcast an FM IBOC digital radio broadcasting signal. The studio site includes, among other things, studio automation equipment 34, an Ensemble Operations Center (EOC) 16 that includes an importer 18, an exporter 20, an exciter auxiliary service unit (EASU) 22. An STL transmitter 48 links the EOC with the transmitter site. The transmitter site includes an STL receiver 54, an exciter 56 that includes an exciter engine (exgine) subsystem 58, and an analog exciter 60. While in FIG. 1 the exporter is resident at a radio station's studio site and the exciter is located at the transmission site, these elements may be co-located at the transmission site.

At the studio site, the studio automation equipment supplies main program service (MPS) audio 42 to the EASU, MPS data 40 to the exporter, supplemental program service (SPS) audio 38 to the importer, and SPS data 36 to the importer. MPS audio serves as the main audio programming source. In hybrid modes, it preserves the existing analog radio programming formats in both the analog and digital transmissions. MPS data or SPS data, also known as program service data (PSD), includes information such as music title, artist, album name, etc. Supplemental program service can include supplementary audio content as well as program service data.

The importer contains hardware and software for supplying advanced application services (AAS). AAS can include any type of data that is not classified as MPS, SPS, or Station Information Service (SIS). SIS provides station information, such as call sign, absolute time, position correlated to GPS, etc. Examples of AAS include a Service Information Guide (SIG), which provides detailed station service information, and data services for electronic program guides, navigation maps, real-time traffic and weather information, multimedia applications, other audio services, and other data content. The content for AAS can be supplied by service providers 44, which provide service data 46 to the importer via an application program interface (API). The service providers may be a broadcaster located at the studio site or externally sourced third-party providers of services and content. The importer can establish session connections between multiple service providers. The importer encodes and multiplexes service data 46, SPS audio 38, and SPS data 36 to produce exporter link data 24, which is output to the exporter via a data link. As part of the AAS, the importer also encodes a SIG, in which it typically identifies and describes services. For example, the SIG may include data identifying the genre of the services available on the current frequency (e.g., the genre of MPS audio and any SPS audio).

The exporter 20 contains the hardware and software necessary to supply the main program service and SIS for broadcasting. The exporter accepts digital MPS audio 26 over an audio interface and compresses the audio. The exporter also multiplexes MPS data 40, exporter link data 24, and the compressed digital MPS audio to produce exciter link data 52. In addition, the exporter accepts analog MPS audio 28 over its audio interface and applies a pre-programmed delay to it to produce a delayed analog MPS audio signal 30. This analog audio can be broadcast as a backup channel for hybrid IBOC digital radio broadcasting broadcasts. The delay compensates for the system delay of the digital MPS audio, allowing receivers to blend between the digital and analog program without a shift in time. In an AM transmission system, the delayed MPS audio signal 30 is converted by the exporter to a mono signal and sent directly to the STL as part of the exciter link data 52.

The EASU 22 accepts MPS audio 42 from the studio automation equipment, rate converts it to the proper system clock, and outputs two copies of the signal, one digital (26) and one analog (28). The EASU includes a GPS receiver that is connected to an antenna 25. The GPS receiver allows the EASU to derive a master clock signal, which is synchronized to the exciter's clock by use of GPS units. The EASU provides the master system clock used by the exporter. The EASU is also used to bypass (or redirect) the analog MPS audio from being passed through the exporter in the event the exporter has a catastrophic fault and is no longer operational. The bypassed audio 32 can be fed directly into the STL transmitter, eliminating a dead-air event.

STL transmitter 48 receives delayed analog MPS audio 50 and exciter link data 52. It outputs exciter link data and delayed analog MPS audio over STL link 14, which may be either unidirectional or bidirectional. The STL link may be a digital microwave or Ethernet link, for example, and may use the standard User Datagram Protocol or the standard TCP/IP.

The transmitter site includes an STL receiver 54, an exciter engine (exgine) 56 and an analog exciter 60. The STL receiver 54 receives exciter link data, including audio and data signals as well as command and control messages, over the STL link 14. The exciter link data is passed to the exciter 56, which produces the IBOC digital radio broadcasting waveform. The exciter includes a host processor, digital up-converter, RF up-converter, and exgine subsystem 58. The exgine accepts exciter link data and modulates the digital portion of the IBOC digital radio broadcasting waveform. The digital up-converter of exciter 56 converts from digital-to-analog the baseband portion of the exgine output. The digital-to-analog conversion is based on a GPS clock, common to that of the exporter's GPS-based clock derived from the EASU. Thus, the exciter 56 includes a GPS unit and antenna 57. An alternative method for synchronizing the exporter and exciter clocks can be found in U.S. Pat. No. 7,512,175, the disclosure of which is hereby incorporated by reference in its entirety. The RF up-converter of the exciter up-converts the analog signal to the proper in-band channel frequency. The up-converted signal is then passed to the high power amplifier 62 and antenna 64 for broadcast. In an AM transmission system, the exgine subsystem coherently adds the backup analog MPS audio to the digital waveform in the hybrid mode; thus, the AM transmission system does not include the analog exciter 60. In addition, in an AM transmission system, the exciter 56 produces phase and magnitude information and the analog signal is output directly to the high power amplifier.

IBOC digital radio broadcasting signals can be transmitted in both AM and FM radio bands, using a variety of waveforms. The waveforms include an FM hybrid IBOC digital radio broadcasting waveform, an FM all-digital IBOC digital radio broadcasting waveform, an AM hybrid IBOC digital radio broadcasting waveform, and an AM all-digital IBOC digital radio broadcasting waveform.

Figure 2:
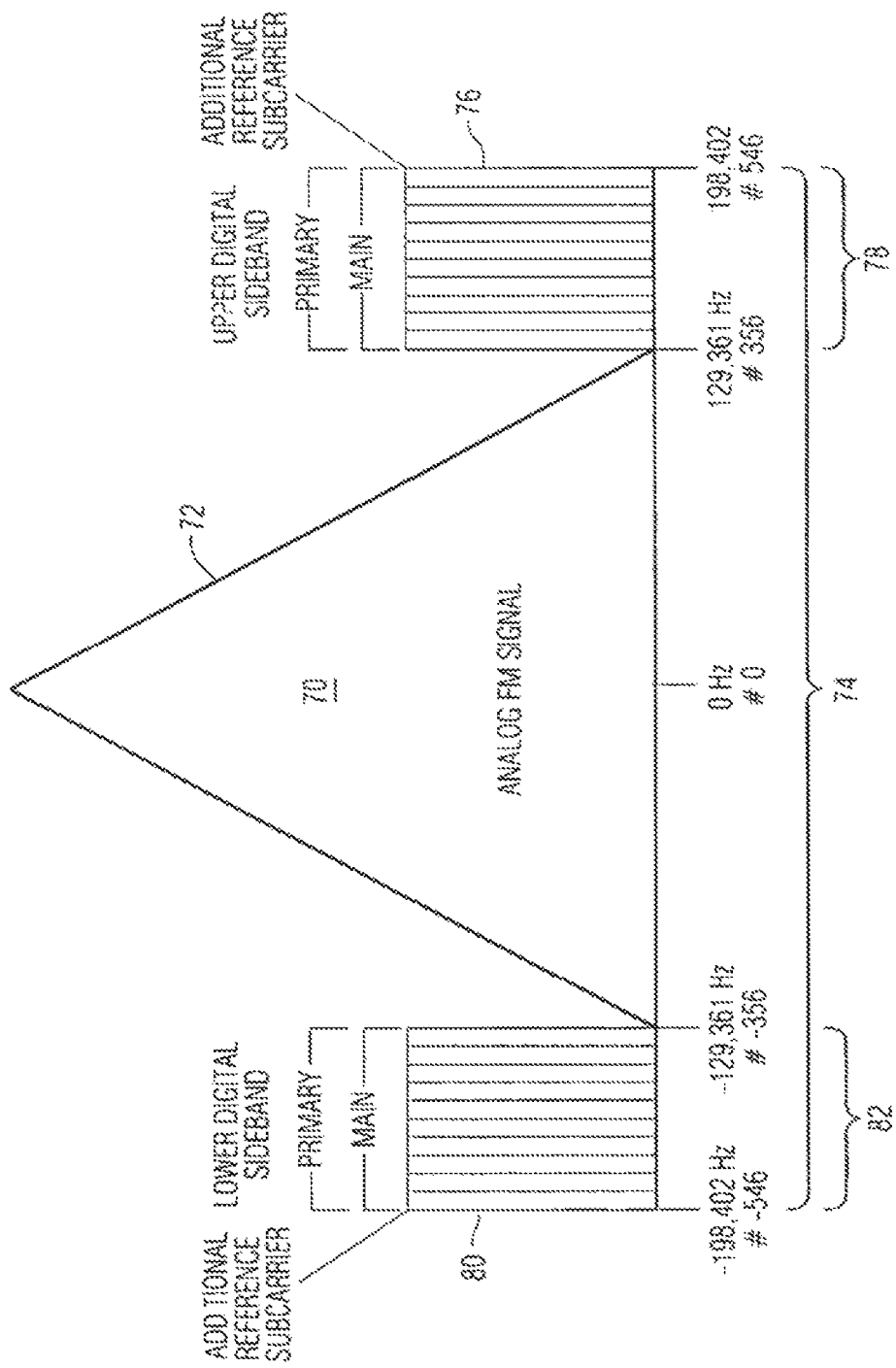
FIG. 2 is a schematic representation of a hybrid FM IBOC waveform.

FIG. 2 is a schematic representation of a hybrid FM IBOC waveform 70. The waveform includes an analog modulated signal 72 located in the center of a broadcast channel 74, a first plurality of evenly spaced orthogonally frequency division multiplexed subcarriers 76 in an upper sideband 78, and a second plurality of evenly spaced orthogonally frequency division multiplexed subcarriers 80 in a lower sideband 82. The digitally modulated subcarriers are divided into partitions and various subcarriers are designated as reference subcarriers. A frequency partition is a group of 19 OFDM subcarriers containing 18 data subcarriers and one reference subcarrier.

The hybrid waveform includes an analog FM-modulated signal, plus digitally modulated primary main subcarriers. The subcarriers are located at evenly spaced frequency locations. The subcarrier locations are numbered from −546 to +546. In the waveform of FIG. 2, the subcarriers are at locations +356 to +546 and −356 to −546. Each primary main sideband is comprised of ten frequency partitions. Subcarriers 546 and −546, also included in the primary main sidebands, are additional reference subcarriers. The amplitude of each subcarrier can be scaled by an amplitude scale factor.

Figure 3:
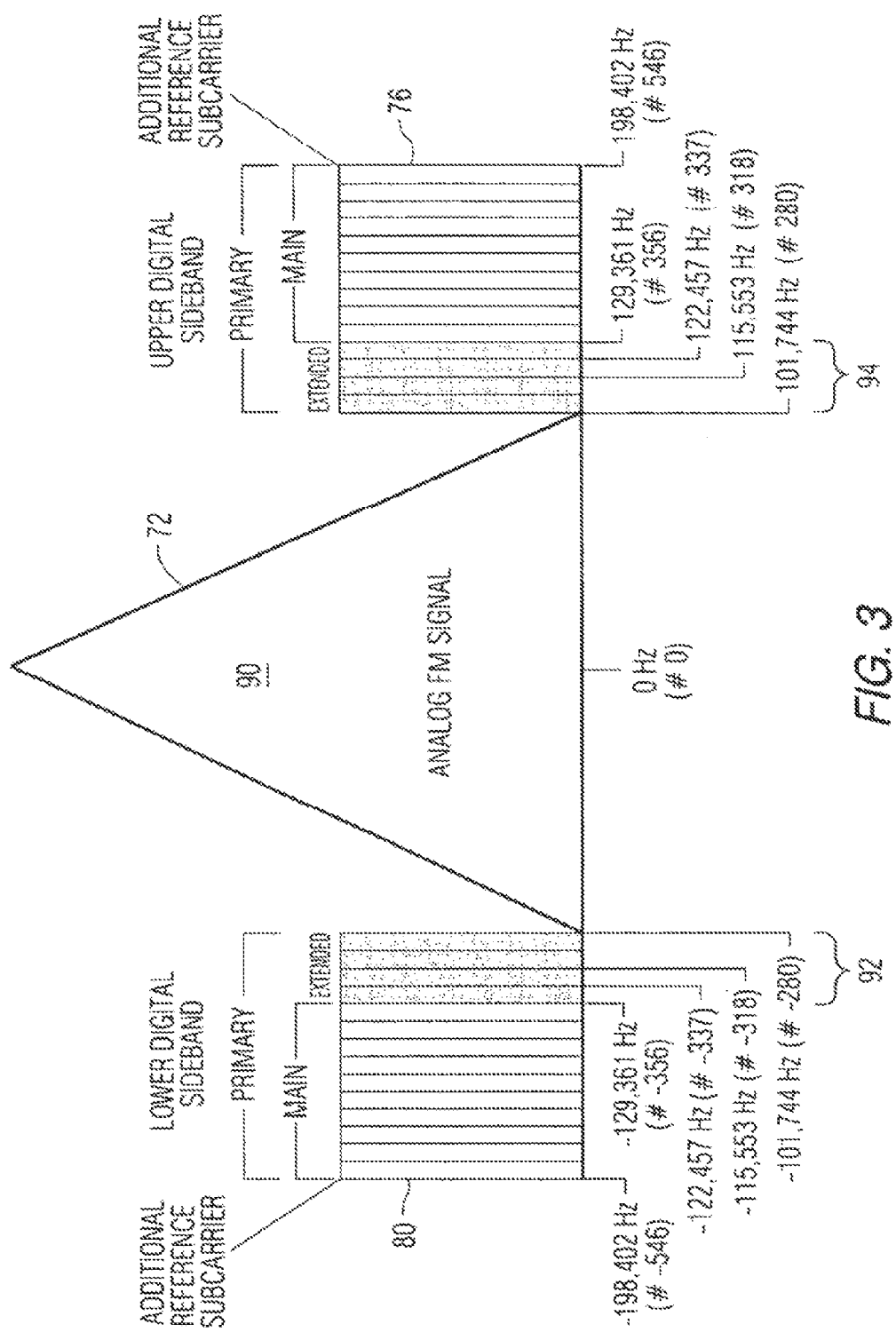
FIG. 3 is a schematic representation of an extended hybrid FM IBOC waveform.

FIG. 3 is a schematic representation of an extended hybrid FM IBOC waveform 90. The extended hybrid waveform is created by adding primary extended sidebands 92, 94 to the primary main sidebands present in the hybrid waveform. One, two, or four frequency partitions can be added to the inner edge of each primary main sideband. The extended hybrid waveform includes the analog FM signal plus digitally modulated primary main subcarriers (subcarriers +356 to +546 and −356 to −546) and some or all primary extended subcarriers (subcarriers +280 to +355 and −280 to −355).

The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 4:
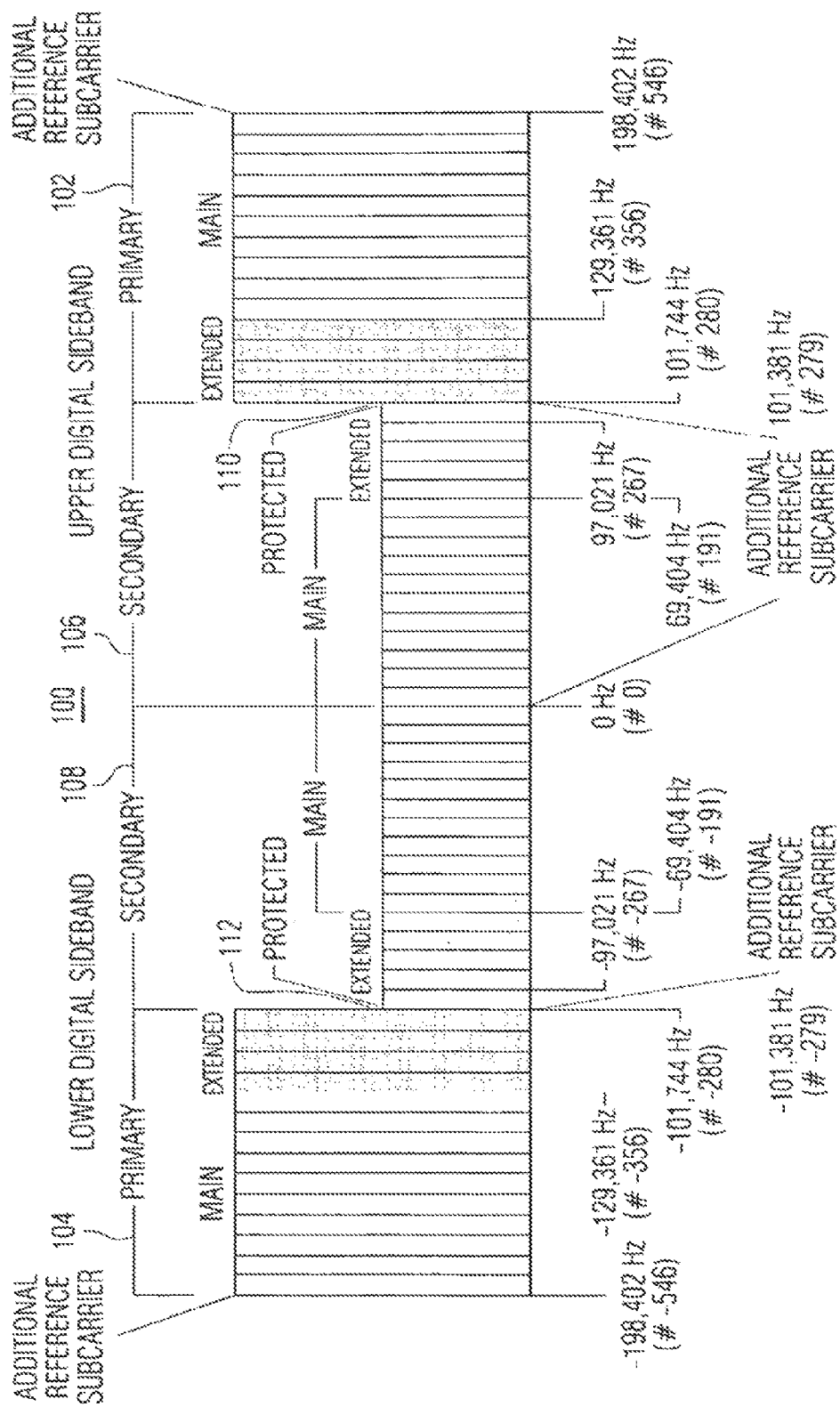
FIG. 4 is a schematic representation of an all-digital FM IBOC waveform.

FIG. 4 is a schematic representation of an all-digital FM IBOC waveform 100. The all-digital waveform is constructed by disabling the analog signal, fully extending the bandwidth of the primary digital sidebands 102, 104, and adding lower-power secondary sidebands 106, 108 in the spectrum vacated by the analog signal. The all-digital waveform in the illustrated embodiment includes digitally modulated subcarriers at subcarrier locations −546 to +546, without an analog FM signal.

In addition to the ten main frequency partitions, all four extended frequency partitions are present in each primary sideband of the all-digital waveform. Each secondary sideband also has ten secondary main (SM) and four secondary extended (SX) frequency partitions. Unlike the primary sidebands, however, the secondary main frequency partitions are mapped nearer to the channel center with the extended frequency partitions farther from the center.

Each secondary sideband also supports a small secondary protected (SP) region 110, 112 including 12 OFDM subcarriers and reference subcarriers 279 and −279. The sidebands are referred to as "protected" because they are located in the area of spectrum least likely to be affected by analog or digital interference. An additional reference subcarrier is placed at the center of the channel (0). Frequency partition ordering of the SP region does not apply since the SP region does not contain frequency partitions.

Each secondary main sideband spans subcarriers 1 through 190 or −1 through −190. The upper secondary extended sideband includes subcarriers 191 through 266, and the upper secondary protected sideband includes subcarriers 267 through 278, plus additional reference subcarrier 279. The lower secondary extended sideband includes subcarriers −191 through −266, and the lower secondary protected sideband includes subcarriers −267 through −278, plus additional reference subcarrier −279. The total frequency span of the entire all-digital spectrum may be up to 396,803 Hz. The amplitude of each subcarrier can be scaled by an amplitude scale factor.

In each of the waveforms, the digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

In the hybrid waveform, the digital signal is transmitted in primary main (PM) sidebands on either side of the analog FM signal in the hybrid waveform. The power level of each sideband is appreciably below the total power in the analog FM signal. The analog signal may be monophonic or stereophonic, and may include subsidiary communications authorization (SCA) channels.

In the extended hybrid waveform, the bandwidth of the hybrid sidebands can be extended toward the analog FM signal to increase digital capacity. This additional spectrum, allocated to the inner edge of each primary main sideband, is termed the primary extended (PX) sideband.

In the all-digital waveform, the analog signal is removed and the bandwidth of the primary digital sidebands is fully extended as in the extended hybrid waveform. In addition, this waveform allows lower-power digital secondary sidebands to be transmitted in the spectrum vacated by the analog FM signal.

FIG. 5 is a schematic representation of an AM hybrid IBOC digital radio broadcasting waveform 120. The hybrid format includes the conventional AM analog signal 122 (bandlimited to about ±5 kHz) along with a nearly 30 kHz wide digital radio broadcasting signal 124. The spectrum is contained within a channel 126 having a bandwidth of about 30 kHz. The channel is divided into upper 130 and lower 132 frequency bands. The upper band extends from the center frequency of the channel to about +15 kHz from the center frequency. The lower band extends from the center frequency to about −15 kHz from the center frequency.

The AM hybrid IBOC digital radio broadcasting signal format in one example comprises the analog modulated carrier signal 134 plus OFDM subcarrier locations spanning the upper and lower bands. Coded digital information representative of the audio or data signals to be transmitted (program material), is transmitted on the subcarriers. The symbol rate is less than the subcarrier spacing due to a guard time between symbols.

As shown in FIG. 5, the upper band is divided into a primary section 136, a secondary section 138, and a tertiary section 144. The lower band is divided into a primary section 140, a secondary section 142, and a tertiary section 143. For the purpose of this explanation, the tertiary sections 143 and 144 can be considered to include a plurality of groups of subcarriers labeled 146 and 152 in FIG. 5. Subcarriers within the tertiary sections that are positioned near the center of the channel are referred to as inner subcarriers, and subcarriers within the tertiary sections that are positioned farther from the center of the channel are referred to as outer subcarriers. The groups of subcarriers 146 and 152 in the tertiary sections have substantially constant power levels. FIG. 5 also shows two reference subcarriers 154 and 156 for system control, whose levels are fixed at a value that is different from the other sidebands.

The power of subcarriers in the digital sidebands is significantly below the total power in the analog AM signal. The level of each OFDM subcarrier within a given primary or secondary section is fixed at a constant value. Primary or secondary sections may be scaled relative to each other. In addition, status and control information is transmitted on reference subcarriers located on either side of the main carrier. A separate logical channel, such as an IBOC Data Service (IDS) channel can be transmitted in individual subcarriers just above and below the frequency edges of the upper and lower secondary sidebands. The power level of each primary OFDM subcarrier is fixed relative to the unmodulated main analog carrier. However, the power level of the secondary subcarriers, logical channel subcarriers, and tertiary subcarriers is adjustable.

Using the modulation format of FIG. 5, the analog modulated carrier and the digitally modulated subcarriers are transmitted within the channel mask specified for standard AM broadcasting in the United States. The hybrid system uses the analog AM signal for tuning and backup.

FIG. 6 is a schematic representation of the subcarrier assignments for an all-digital AM IBOC digital radio broadcasting waveform. The all-digital AM IBOC digital radio broadcasting signal 160 includes first and second groups 162 and 164 of evenly spaced subcarriers, referred to as the primary subcarriers, that are positioned in upper and lower bands 166 and 168. Third and fourth groups 170 and 172 of subcarriers, referred to as secondary and tertiary subcarriers respectively, are also positioned in upper and lower bands 166 and 168. Two reference subcarriers 174 and 176 of the third group lie closest to the center of the channel. Subcarriers 178 and 180 can be used to transmit program information data.

Figure 7:
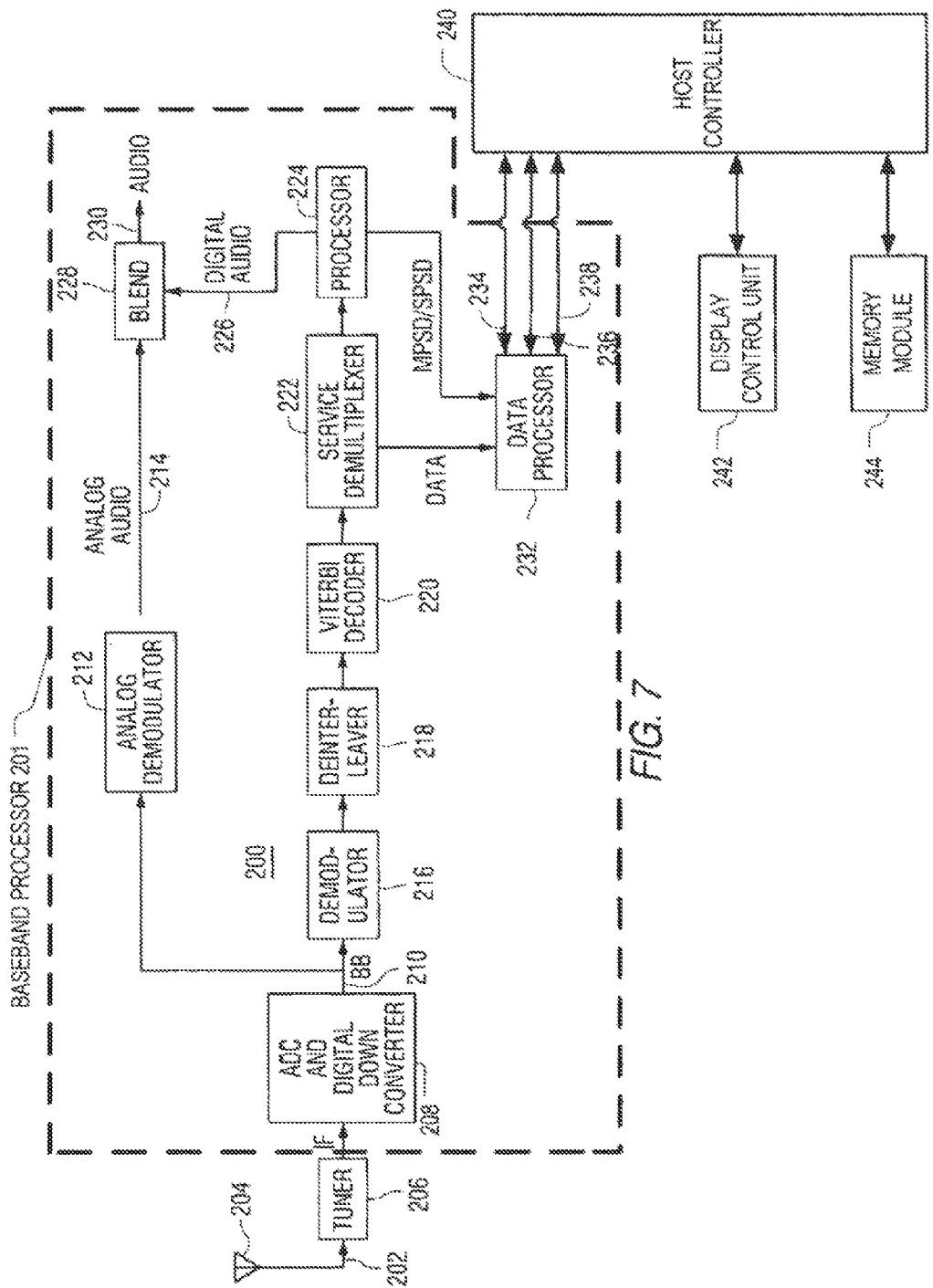
FIG. 7 is a functional block diagram of an AM IBOC digital radio broadcasting receiver in accordance with certain embodiments.

FIG. 7 is a simplified functional block diagram of the relevant components of an AM IBOC digital radio broadcasting receiver 200. While only certain components of the receiver 200 are shown for exemplary purposes, it should be apparent that the receiver may comprise a number of additional components and may be distributed among a number of separate enclosures having tuners and front-ends, speakers, remote controls, various input/output devices, etc. The receiver 200 has a tuner 206 that includes an input 202 connected to an antenna 204. The receiver also includes a front end 201 that includes a digital down converter 208 for producing a baseband signal on line 210. An analog demodulator 212 demodulates the analog modulated portion of the baseband signal to produce an analog audio signal on line 214. A digital demodulator 216 demodulates the digitally modulated portion of the baseband signal. Then the digital signal is deinterleaved by a deinterleaver 218, and decoded by a Viterbi decoder 220. A service demultiplexer 222 separates main and supplemental program signals from data signals. A processor 224 processes the program signals to produce a digital audio signal on line 226. The analog and main digital audio signals are blended as shown in block 228, or a supplemental digital audio signal is passed through, to produce an audio output on line 230. A data processor 232 processes the data signals and produces data output signals on lines 234, 236 and 238. The data lines 234, 236, and 238 may be multiplexed together onto a suitable bus such as an inter-integrated circuit ($I^2C$), serial peripheral interface (SPI), universal asynchronous receiver/transmitter (UART), or universal serial bus (USB). The data signals can include, for example, SIS, MPS data, SPS data, and one or more AAS.

The host controller 240 receives and processes the data signals (e.g., the SIS, MPSD, SPSD, and AAS signals). The host controller 240 comprises a microcontroller that is coupled to the display control unit (DCU) 242 and memory module 244. Any suitable microcontroller could be used such as an Atmel® AVR 8-bit reduced instruction set computer (RISC) microcontroller, an advanced RISC machine (ARM®) 32-bit microcontroller or any other suitable microcontroller. Additionally, a portion or all of the functions of the host controller 240 could be performed in a baseband processor (e.g., the processor 224 and/or data processor 232). The DCU 242 comprises any suitable I/O processor that controls the display, which may be any suitable visual display such as an LCD or LED display. In certain embodiments, the DCU 242 may also control user input components via touch-screen display. In certain embodiments the host controller 240 may also control user input from a keyboard, dials, knobs or other suitable inputs. The memory module 244 may include any suitable data storage medium such as RAM, Flash ROM (e.g., an SD memory card), and/or a hard disk drive. In certain embodiments, the memory module 244 may be included in an external component that communicates with the host controller 240 such as a remote control.

FIG. 8a is a simplified functional block diagram of the relevant components of an FM IBOC digital radio broadcasting receiver 250. While only certain components of the receiver 250 are shown for exemplary purposes, it should be apparent that the receiver may comprise a number of additional components and may be distributed among a number of separate enclosures having tuners and front-ends, speakers, remote controls, various input/output devices, etc. The exemplary receiver includes a tuner 256 that has an input 252 connected to an antenna 254. The receiver also includes a front end 251. The IF signal from the tuner 256 is provided to an analog-to-digital converter and digital down converter 258 to produce a baseband signal at output 260 comprising a series of complex signal samples. The signal samples are complex in that each sample comprises a "real" component and an "imaginary" component. An analog demodulator 262 demodulates the analog modulated portion of the baseband signal to produce an analog audio signal on line 264. The digitally modulated portion of the sampled baseband signal is next filtered by isolation filter 266, which has a pass-band frequency response comprising the collective set of subcarriers $f_1$-$f_n$ present in the received OFDM signal. First adjacent canceller (FAC) 268 suppresses the effects of a first-adjacent interferer. Complex signal 269 is routed to the input of acquisition module 296, which acquires or recovers OFDM symbol timing offset or error and carrier frequency offset or error from the received OFDM symbols as represented in received complex signal 298. Acquisition module 296 develops a symbol timing offset Δt and carrier frequency offset Δf, as well as status and control information. The signal is then demodulated (block 272) to demodulate the digitally modulated portion of the baseband signal. Then the digital signal is deinterleaved by a deinterleaver 274, and decoded by a Viterbi decoder 276. A service demultiplexer 278 separates main and supplemental program signals from data signals. A processor 280 processes the main and supplemental program signals to produce a digital audio signal on line 282 and MPSD/SPSD 281. The analog and main digital audio signals are blended as shown in block 284, or the supplemental program signal is passed through, to produce an audio output on line 286. A data processor 288 processes the data signals and produces data output signals on lines 290, 292 and 294. The data lines 290, 292 and 294 may be multiplexed together onto a suitable bus such as an I²C, SPI, UART, or USB. The data signals can include, for example, SIS, MPS data, SPS data, and one or more AAS.

The host controller 296 receives and processes the data signals (e.g., SIS, MPS data, SPS data, and AAS). The host controller 296 comprises a microcontroller that is coupled to the DCU 298 and memory module 300. Any suitable microcontroller could be used such as an Atmel® AVR 8-bit RISC microcontroller, an advanced RISC machine (ARM®) 32-bit microcontroller or any other suitable microcontroller. Additionally, a portion or all of the functions of the host controller 296 could be performed in a baseband processor (e.g., the processor 280 and/or data processor 288). The DCU 298 comprises any suitable I/O processor that controls the display, which may be any suitable visual display such as an LCD or LED display. In certain embodiments, the DCU 298 may also control user input components via a touch-screen display. In certain embodiments the host controller 296 may also control user input from a keyboard, dials, knobs or other suitable inputs. The memory module 300 may include any suitable data storage medium such as RAM, Flash ROM (e.g., an SD memory card), and/or a hard disk drive. In certain embodiments, the memory module 300 may be included in an external component that communicates with the host controller 296 such as a remote control.

In practice, many of the signal processing functions shown in the receivers of FIGS. 7 and 8a can be implemented using one or more integrated circuits. For example, while in FIGS. 7 and 8a the signal processing block, host controller, DCU, and memory module are shown as separate components, the functions of two or more of these components could be combined in a single processor (e.g., a System on a Chip (SoC)).

Figure 9A:
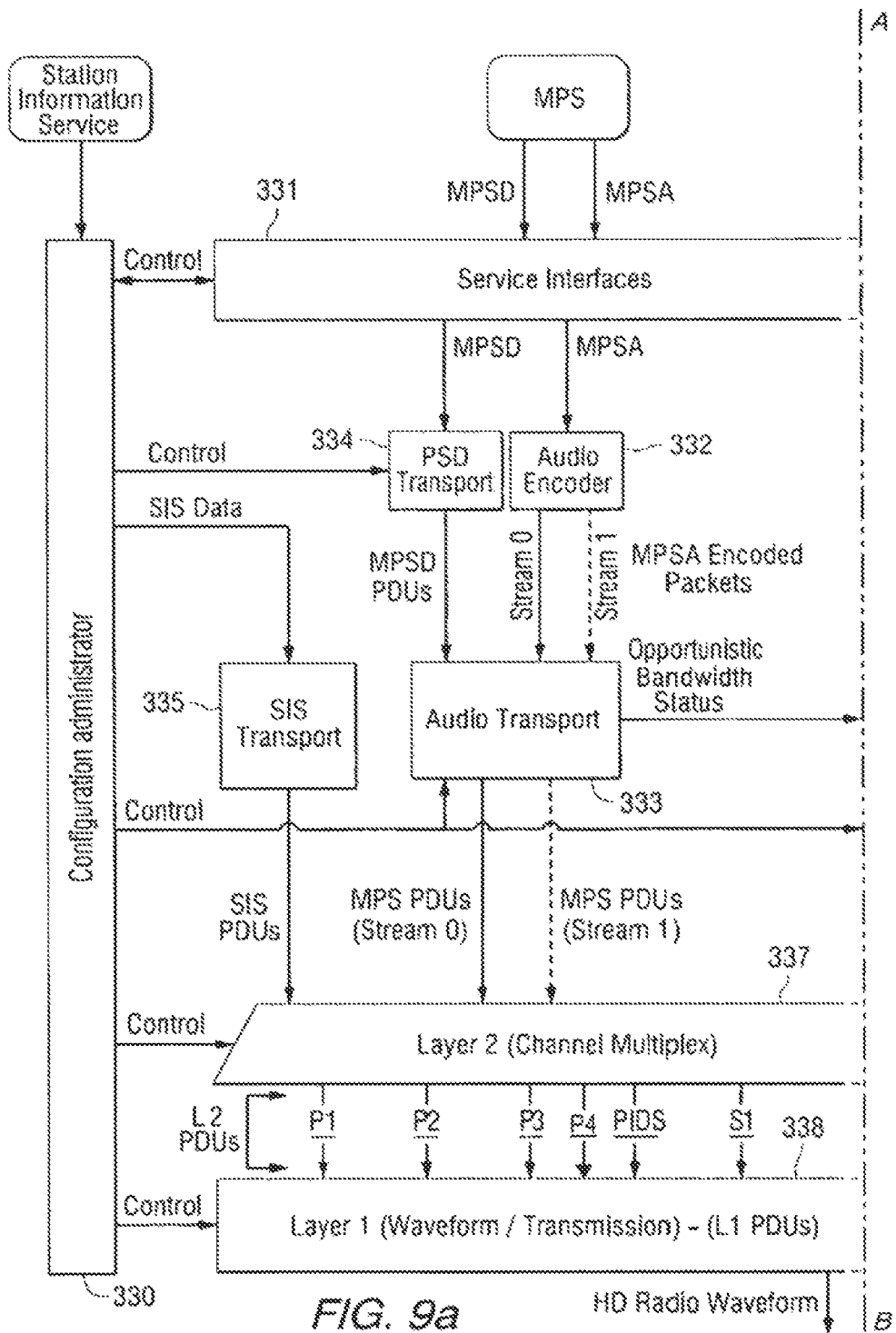
FIGS. 9a and 9b are diagrams of an IBOC digital radio broadcasting logical protocol stack from the broadcast perspective.
Figure 9B:
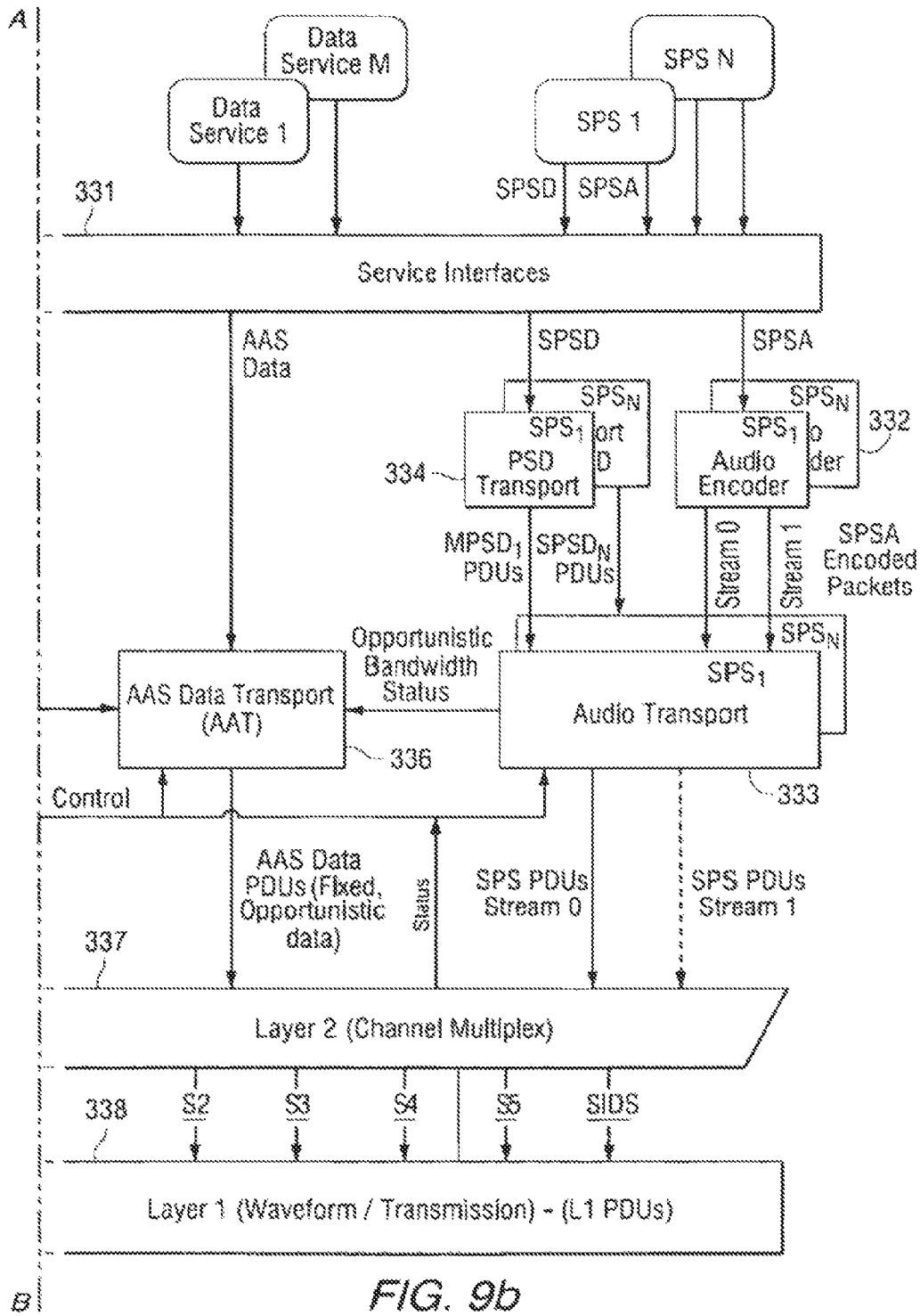

FIGS. 9a and 9b are diagrams of an IBOC digital radio broadcasting logical protocol stack from the transmitter perspective. From the receiver perspective, the logical stack will be traversed in the opposite direction. Most of the data being passed between the various entities within the protocol stack are in the form of protocol data units (PDUs). A PDU is a structured data block that is produced by a specific layer (or process within a layer) of the protocol stack. The PDUs of a given layer may encapsulate PDUs from the next higher layer of the stack and/or include content data and protocol control information originating in the layer (or process) itself. The PDUs generated by each layer (or process) in the transmitter protocol stack are inputs to a corresponding layer (or process) in the receiver protocol stack.

As shown in FIGS. 9a and 9b, there is a configuration administrator 330, which is a system function that supplies configuration and control information to the various entities within the protocol stack. The configuration/control information can include user defined settings, as well as information generated from within the system such as GPS time and position. The service interfaces 331 represent the interfaces for all services. The service interface may be different for each of the various types of services. For example, for MPS audio and SPS audio, the service interface may be an audio card. For MPS data and SPS data the interfaces may be in the form of different APIs. For all other data services the interface is in the form of a single API. An audio encoder 332 encodes both MPS audio and SPS audio to produce core (Stream 0) and optional enhancement (Stream 1) streams of MPS and SPS audio encoded packets, which are passed to audio transport 333. Audio encoder 332 also relays unused capacity status to other parts of the system, thus allowing the inclusion of opportunistic data. MPS and SPS data is processed by PSD transport 334 to produce MPS and SPS data PDUs, which are passed to audio transport 333. Audio transport 333 receives encoded audio packets and PSD PDUs and outputs bit streams containing both compressed audio and program service data. The SIS transport 335 receives SIS data from the configuration administrator and generates SIS PDUs. A SIS PDU can contain station identification and location information, indications regarding provided audio and data services, as well as absolute time and position correlated to GPS, as well as other information conveyed by the station. The AAS data transport 336 receives AAS data from the service interface, as well as opportunistic bandwidth data from the audio transport, and generates AAS data PDUs, which can be based on quality of service parameters. The transport and encoding functions are collectively referred to as Layer 4 of the protocol stack and the corresponding transport PDUs are referred to as Layer 4 PDUs or L4 PDUs. Layer 2, which is the channel multiplex layer, (337) receives transport PDUs from the SIS transport, AAS data transport, and audio transport, and formats them into Layer 2 PDUs. A Layer 2 PDU includes protocol control information and a payload, which can be audio, data, or a combination of audio and data. Layer 2 PDUs are routed through the correct logical channels to Layer 1 (338), wherein a logical channel is a signal path that conducts L1 PDUs through Layer 1 with a specified grade of service, and possibly mapped into a predefined collection of subcarriers. There are multiple Layer 1 logical channels based on service mode, wherein a service mode is a specific configuration of operating parameters specifying throughput, performance level, and selected logical channels. The number of active Layer 1 logical channels and the characteristics defining them vary for each service mode. Status information is also passed between Layer 2 and Layer 1. Layer 1 converts the PDUs from Layer 2 and system control information into an AM or FM IBOC digital radio broadcasting waveform for transmission. Layer 1 processing can include scrambling, channel encoding, interleaving, OFDM subcarrier mapping, and OFDM signal generation. The output of OFDM signal generation is a complex, baseband, time domain pulse representing the digital portion of an IBOC signal for a particular symbol. Discrete symbols are concatenated to form a continuous time domain waveform, which is modulated to create an IBOC waveform for transmission.

Figure 10:
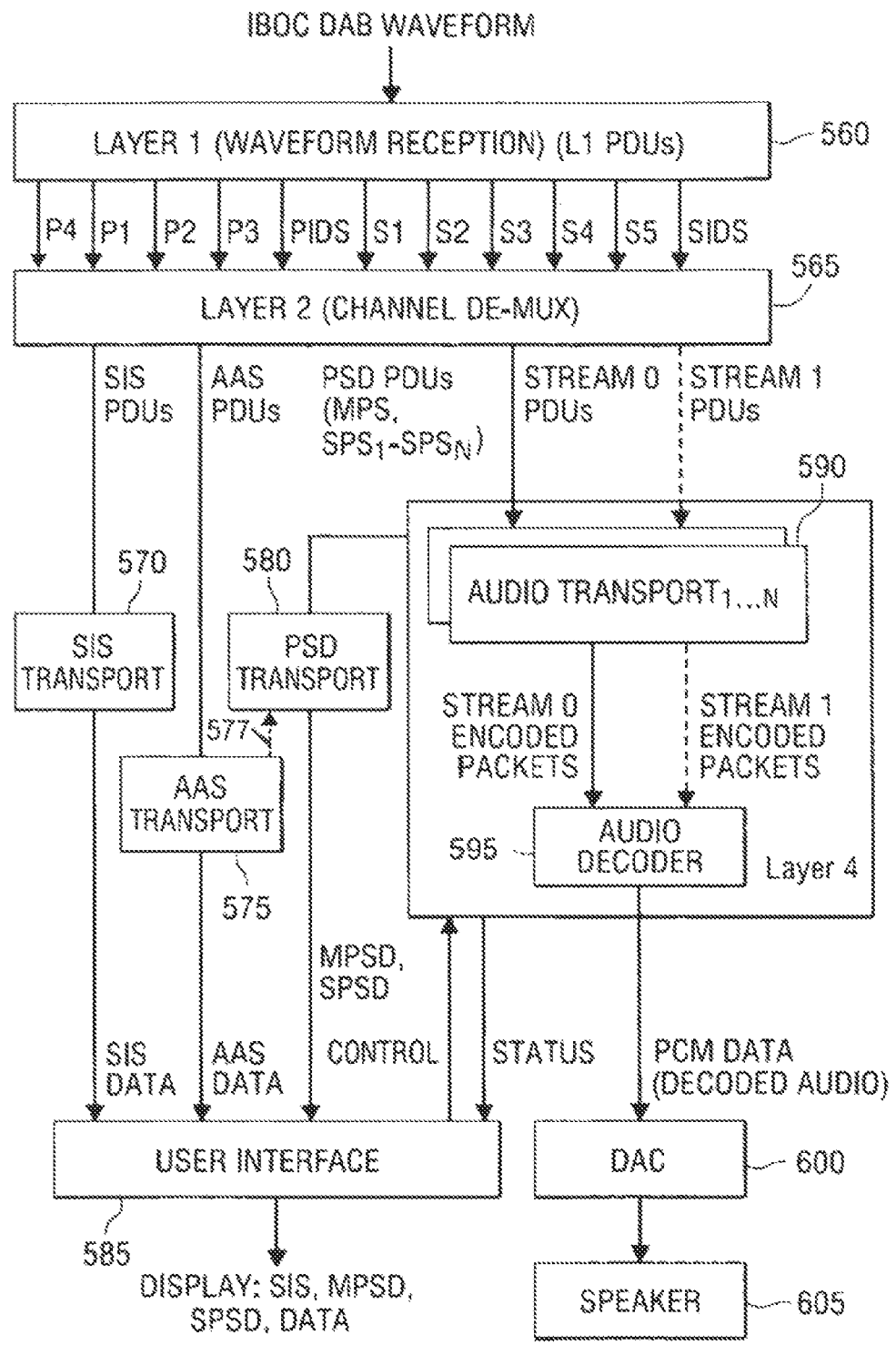
FIG. 10 is a diagram of an IBOC digital radio broadcasting logical protocol stack from the receiver perspective.

FIG. 10 shows the logical protocol stack from the receiver perspective. An IBOC waveform is received by the physical layer, Layer 1 (560), which demodulates the signal and processes it to separate the signal into logical channels. The number and kind of logical channels will depend on the service mode, and may include logical channels P1-P4, Primary IBOC Data Service Logical Channel (PIDS), S1-S5, and SIDS. In addition, logical channels for data services may be divided into sub-channels by, for example, time-division multiplexing. These sub-channels can provide additional divisibility of the logical channels to facilitate a wider variety of data services.

Layer 1 produces L1 PDUs corresponding to the logical channels and sends the PDUs to Layer 2 (565), which demultiplexes the L1 PDUs to produce SIS PDUs, AAS PDUs, and Stream 0 (core) audio PDUs and Stream 1 (optional enhanced) audio PDUs. The SIS PDUs are then processed by the SIS transport 570 to produce SIS data, the AAS PDUs are processed by the AAS transport 575 to produce AAS data, and the PSD PDUs are processed by the PSD transport 580 to produce MPS data (MPSD) and any SPS data (SPSD). Encapsulated PSD data may also be included in AAS PDUs, thus processed by the AAS transport processor 575 and delivered on line 577 to PSD transport processor 580 for further processing and producing MPSD or SPSD. The SIS data, AAS data, MPSD and SPSD are then sent to a user interface 585. The SIS data, if requested by a user, can then be displayed. Likewise, MPSD, SPSD, and any text based or graphical AAS data can be displayed. The Stream 0 and Stream 1 PDUs are processed by Layer 4, comprised of audio transport 590 and audio decoder 595. There may be up to N audio transports corresponding to the number of programs received on the IBOC waveform. Each audio transport produces encoded MPS packets or SPS packets, corresponding to each of the received programs. Layer 4 receives control information from the user interface, including commands such as to store or play programs, and information related to seek or scan for radio stations broadcasting an all-digital or hybrid IBOC signal. Layer 4 also provides status information to the user interface.

A description of a novel technique of deinterleaving in a digital radio broadcast receiver is provided below. First, a conventional block interleaving and deinterleaving process is described with reference to FIGS. 11-17 for illustrative purposes. Then, a description of a technique for deinterleaving data in accordance with exemplary embodiments of the present disclosure is provided with reference to FIGS. 18-22.

Interleaving is a technique used in digital radio communications to mitigate the effect of interference on a communications channel (i.e., mitigate burst errors).

Commonly, block interleavers/deinterleavers are used in digital radio broadcast communications. FIGS. 11-17 illustrate a conventional block interleaving implementation, which uses two tables for the transmitter side interleaver and two tables for the receiver side deinterleaver. For simplicity of explanation, synchronized timing between the transmitter and the receiver is assumed, and therefore intermediate buffering that is typically used, and may not be associated with the interleaving/deinterleaving process, has been ignored. In addition, data units' availability is assumed to be only as needed (i.e., real-time), ignoring intermediate bursts that may occur since this does not impact the example.

A typical conventional block interleaver functions as follows. First, a pair of n row by k column tables (referred to herein as a write table and a read table) are provided in transmitter memory. Thus, a conventional block interleaver with n rows and k columns requires 2×(n·k) memory addresses on the transmitter side. For example, the exemplary transmitter write and read tables shown in FIG. 11 have 11 rows and 7 columns, thus requiring 154 memory addresses. Similarly, a typical conventional block deinterleaver begins by providing a pair of n row by k column tables (also referred to herein as a read table and a write table) in receiver memory. For example, the exemplary receiver read and write tables shown in FIG. 12 have 11 rows and 7 columns, thus requiring 154 memory addresses.

Figure 11:
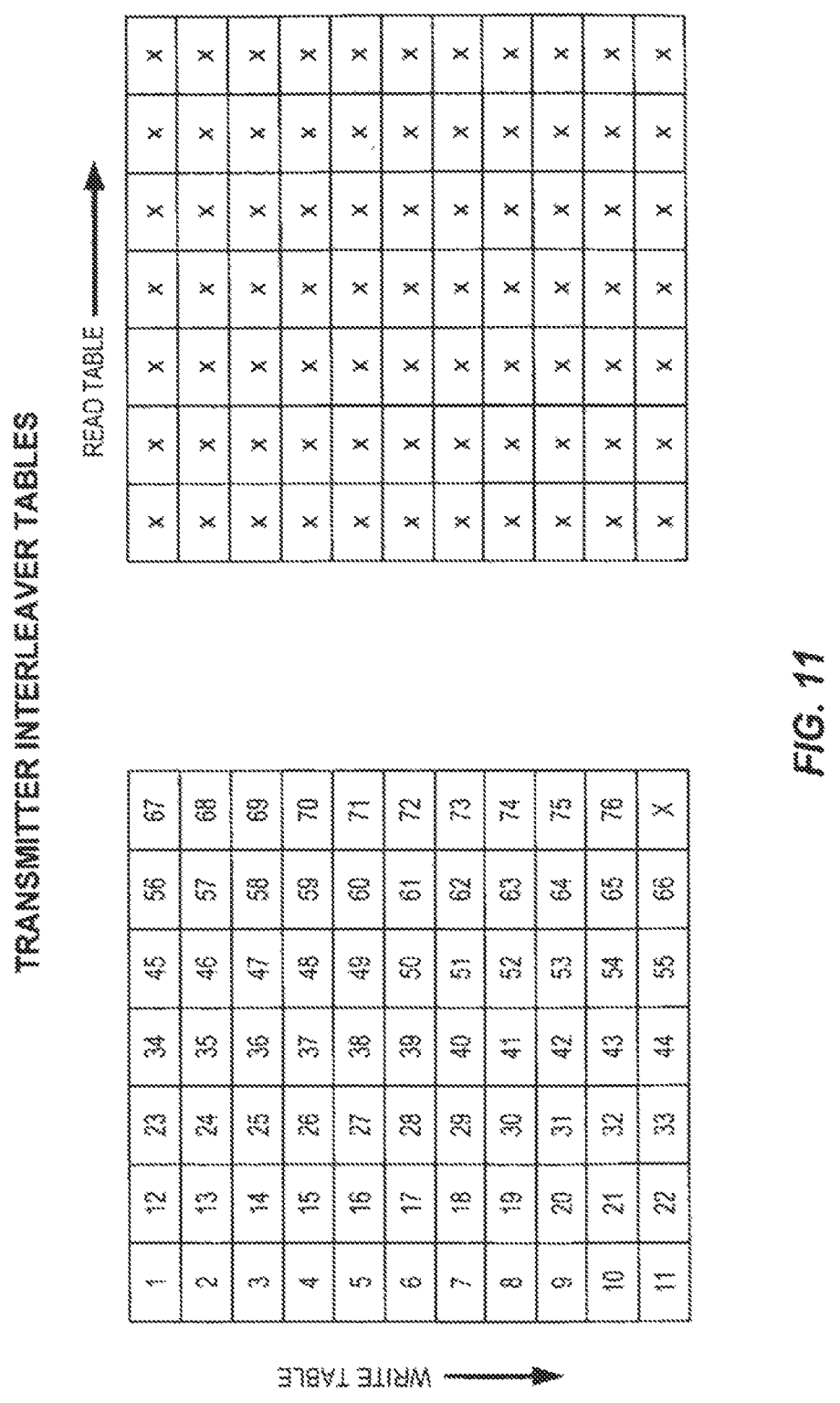

FIG. 11 illustrates exemplary transmitter interleaver tables. In the transmitter, the write table is used for inputting data units into the interleaver that will be transmitted once the table is filled. In particular, encoded data units are input from an encoder and sequentially stored in the write table column-by-column from left to right. The exemplary data units shown in FIG. 11 are numbered 1 to 76 to show that 76 data units have been filled into the write table and one address remains unfilled (designated with an "X"). The read table is read by the transmitter in order to broadcast the digital radio signal. Specifically, encoded data units from the read table are read row-by-row from top to bottom and then output for transmission. In operation, once the write table has been filled with data units, the write table becomes a read table. At the beginning of the interleaving process, the read table is unfilled, and therefore shown containing "X"'s in FIG. 11.

Figure 12:
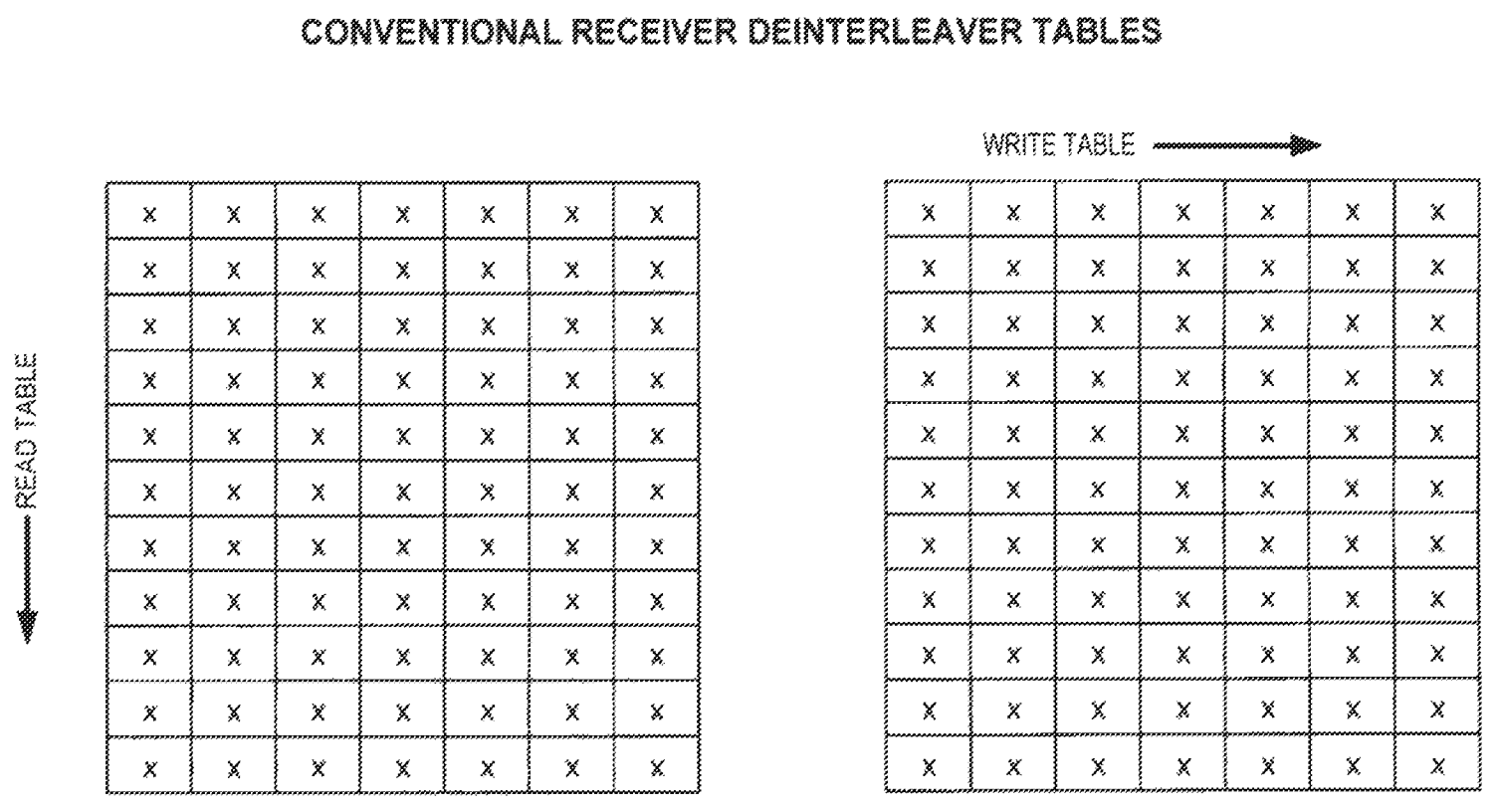

FIG. 12 illustrates conventional receiver block deinterleaver tables. In the receiver, the write table is used for inputting data units received from the demodulator. In particular, encoded data units are input from the demodulator and sequentially stored in the write table row-by-row from top to bottom. Once the write table has been filled with data units, the write table becomes a read table. Referring to the transmitted read table from FIG. 11, at the beginning of the process, since the transmitter's read table was unfilled, meaningless data has been transmitted to the receiver and therefore the receiver's write table in FIG. 12 is filled with meaningless data shown as "X"'s. Data units from the read table are read out to the decoder for further processing. Specifically, encoded data units from the read table are read column-by-column from left to right and then output to the decoder. Since the write and read operations in the conventional block deinterleaver in FIG. 12 are made to/from different memory addresses, the deinterleaving process employs two different memory address calculations and address pointers.

Figure 13:
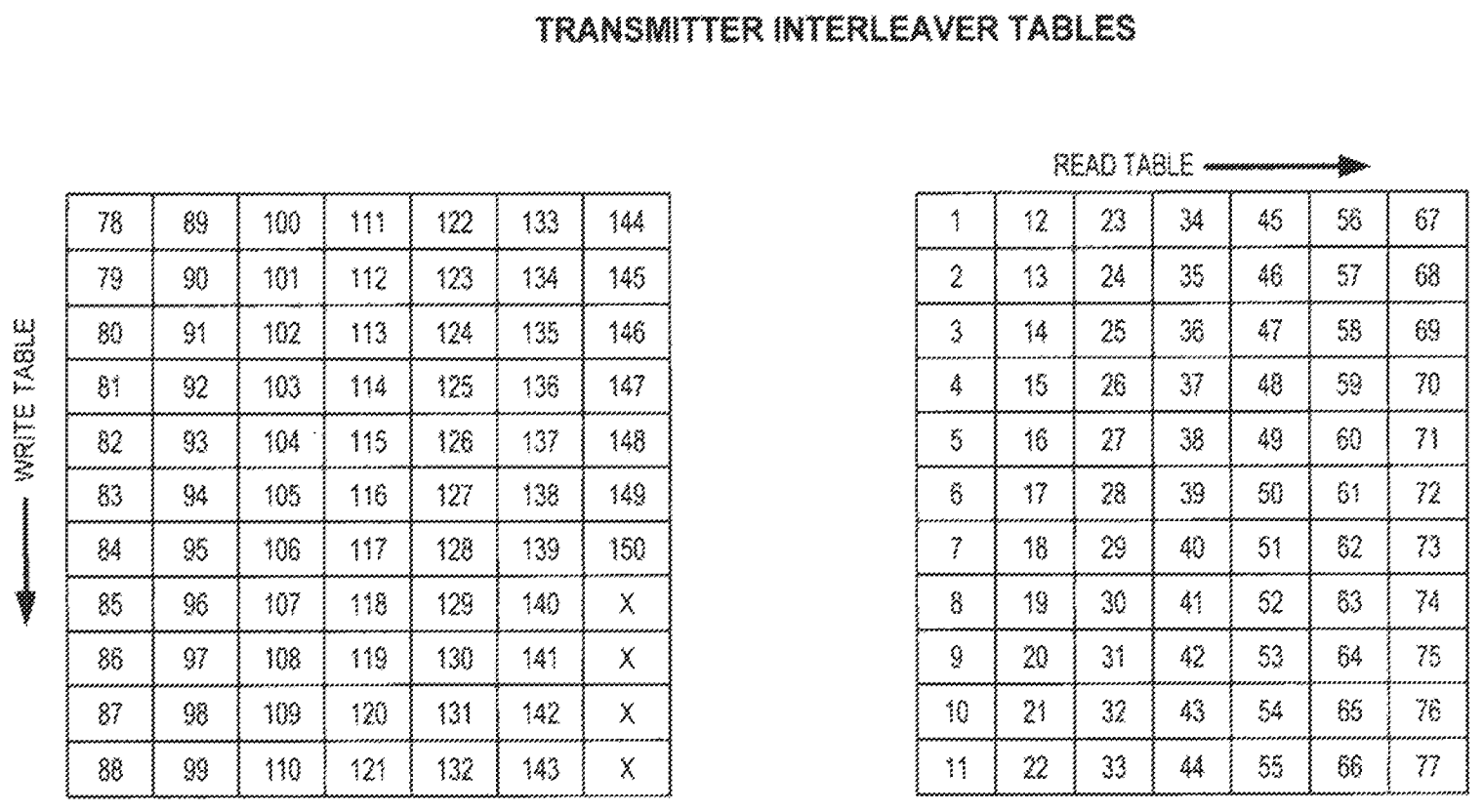
Figure 15:
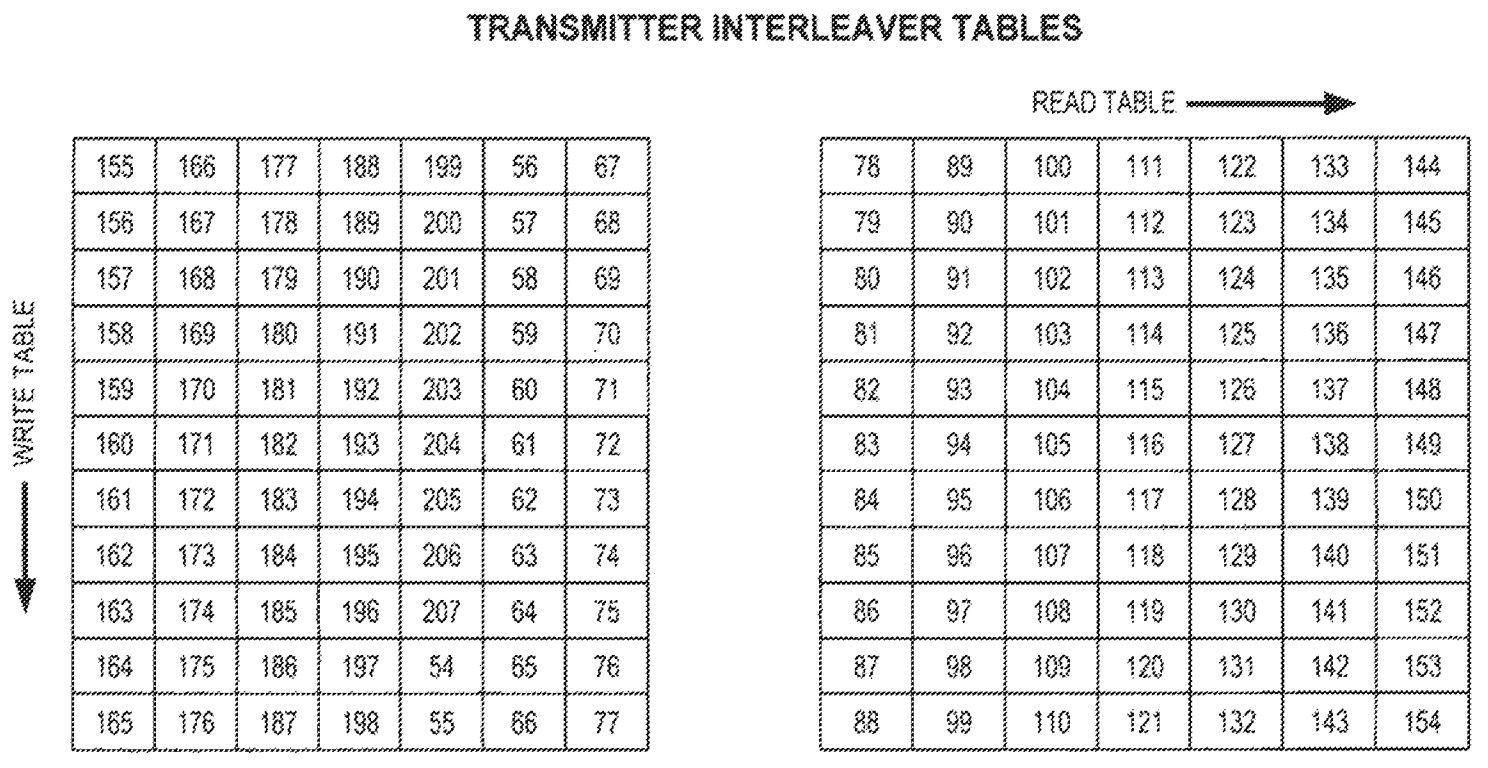

FIGS. 13 and 15 illustrate the transmitter interleaver tables after filling 150 data units and 207 data units respectively. As illustrated in FIG. 13, once the write table from FIG. 11 has been filled, it becomes a read table and the data stored therein is transmitted. FIG. 13 also shows that the next consecutive write table begins filling sequentially with data unit number 78. FIG. 15 similarly shows that the write table from FIG. 13 has become a read table, and that the next consecutive write table begins filling sequentially with data unit number 155.

Figure 14:
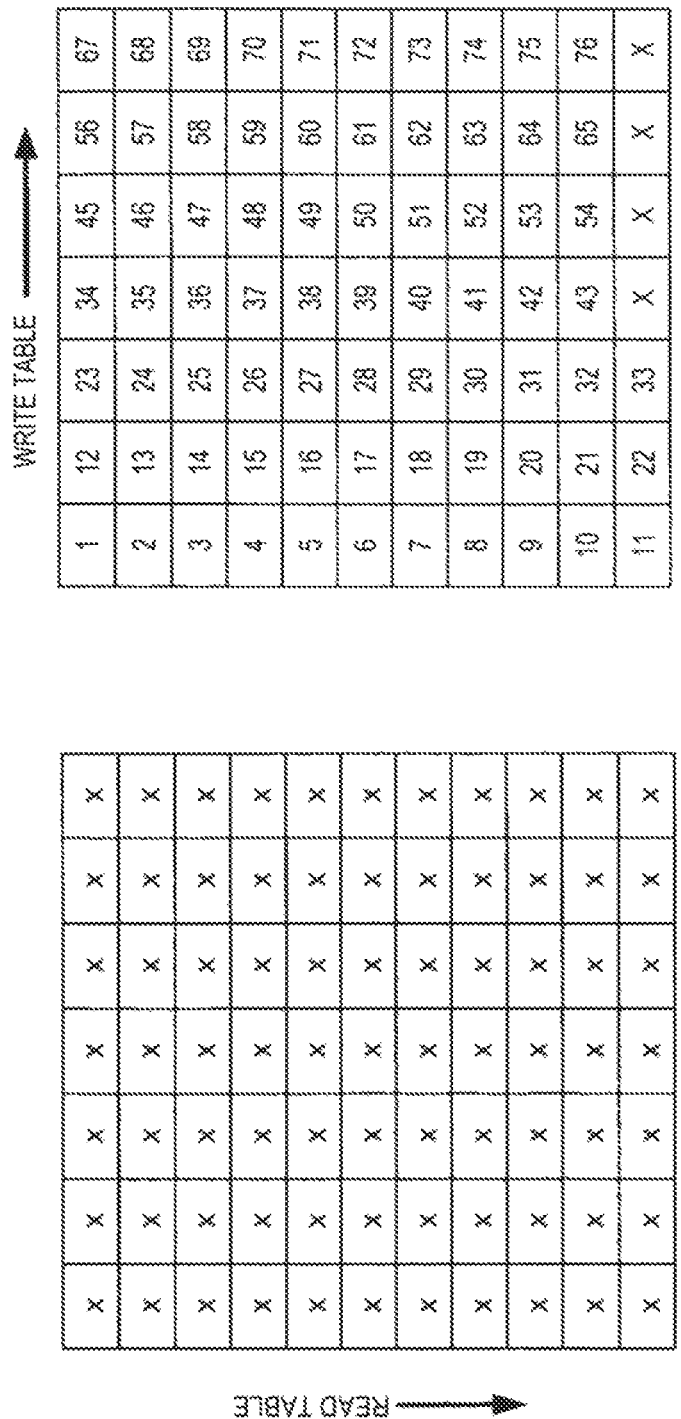
FIG. 14 illustrates conventional receiver block deinterleaver tables (i.e., two tables) after receiving 150 bits.
Figure 16:
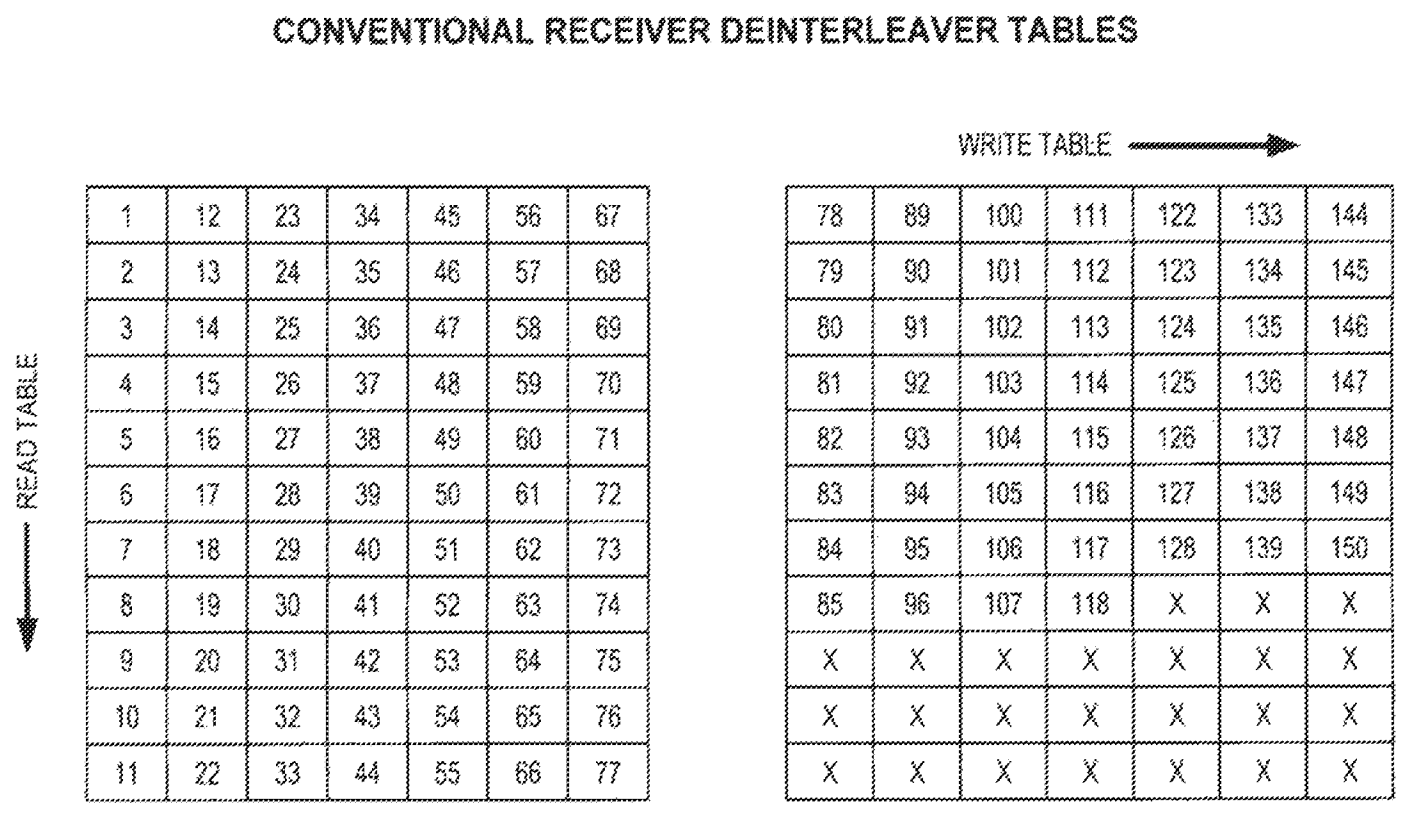

FIGS. 14 and 16 illustrate the receiver block deinterleaver tables after filling 150 data units and 207 data units respectively. As illustrated in FIG. 14, the first 77 data units received are meaningless data shown as "X"'s, and therefore the read table continues to contain meaningless information. However, the first meaningful data has begun to be received and filled into the write table row-by-row. FIG. 16 shows that the write table from FIG. 14 has been filled and become a read table, and that the next consecutive write table begins filling row-by-row with data unit number 78.

Figure 17:
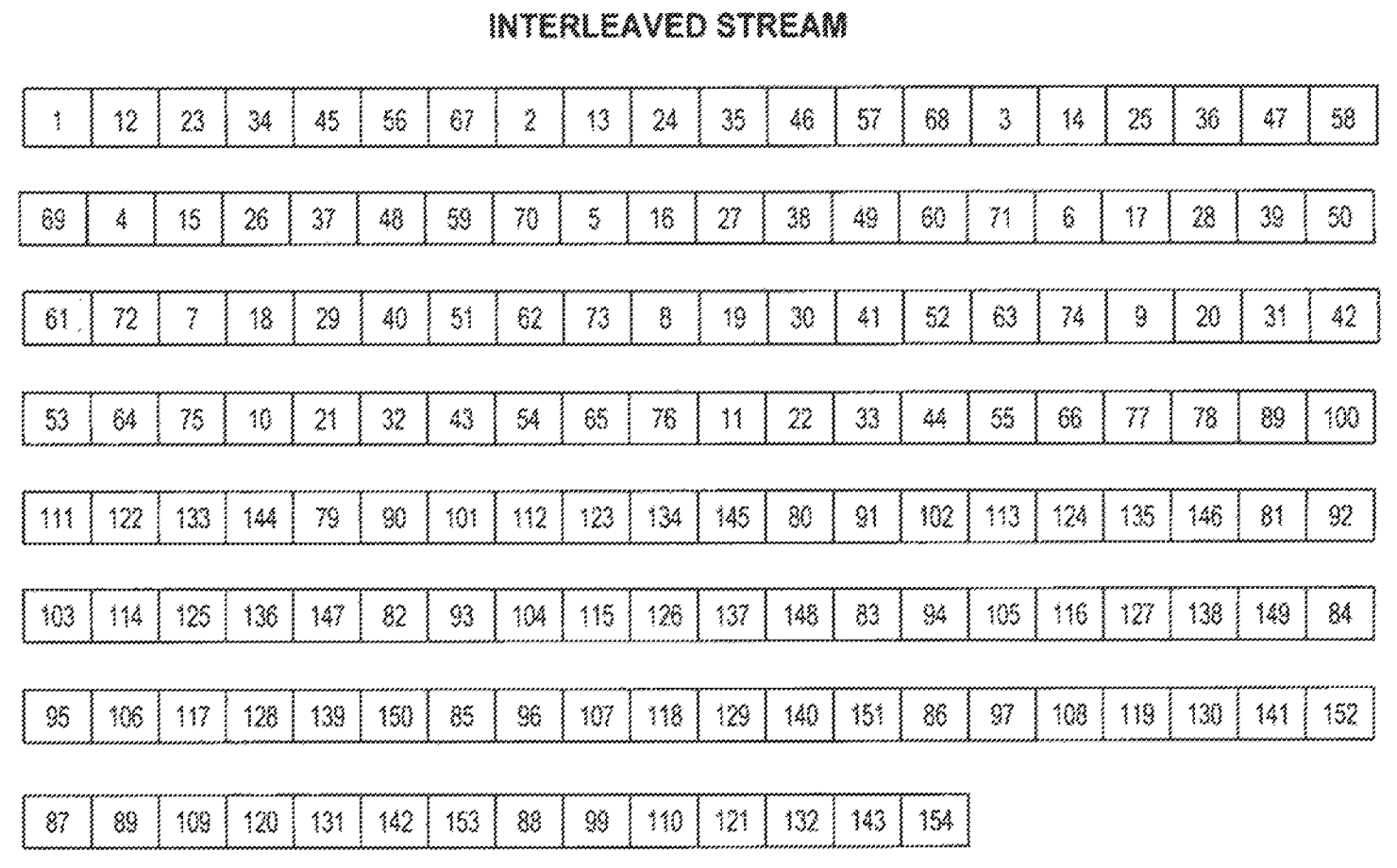

FIG. 17 illustrates an exemplary stream of interleaved data broadcast from the transmitter. As can be seen, the sequence of data units in the interleaved stream corresponds to the sequence of data units that are read out from the transmitter read tables shown in FIGS. 13 and 15.

As can be seen, the implementation of conventional block interleavers is directly related to the generation of data segments. The segments are typically viewed as consecutive pages and sorted accordingly in consecutive tables. Similarly, conventional block deinterleavers imitate the interleaver, thus sorting the same data over consecutive tables. Additionally, as can be seen, the implementation of conventional block deinterleavers employ one calculation for a memory write address, and another calculation for a different memory read address. This results in two operations of address calculation and address pointing to the memory table for every pair of deinterleaver read/write operations.

It should be noted that while memory on the transmitter side may not be an issue, memory size on the receiver side is often limited. It should also be noted that processing operations affect power consumption, and in order to allow for reduced power consumption on the receiver side, it may be desirable to reduce the number of operations on the receiver side. Additionally, since interleaving actually takes place in the transmitter, the receiver may utilize different methods to deinterleave the data. Thus, a new approach to block deinterleaving may be desirable as described with reference to certain exemplary embodiments of the present disclosure.

In this new approach, a single table deinterleaver performs consecutive read and write operations from and to the same address. This new approach allows for the use of, for example, half of the memory (i.e., only n·k memory addresses) of the conventional block interleaver. According to exemplary embodiments, no additional memory is required or used for any intermediary buffering. In addition, the approach may be backwards compatible with conventional 2-table transmitter side block interleavers, and may be, in certain embodiments, implemented only on the receiving side, where memory is typically a critical resource. Additional advantages may include the ability to calculate and maintain only one address pointer for both read and write operations, while the traditional approach typically includes maintaining and calculating two different address pointers, one for read operations and one for write operations.

Figure 8:
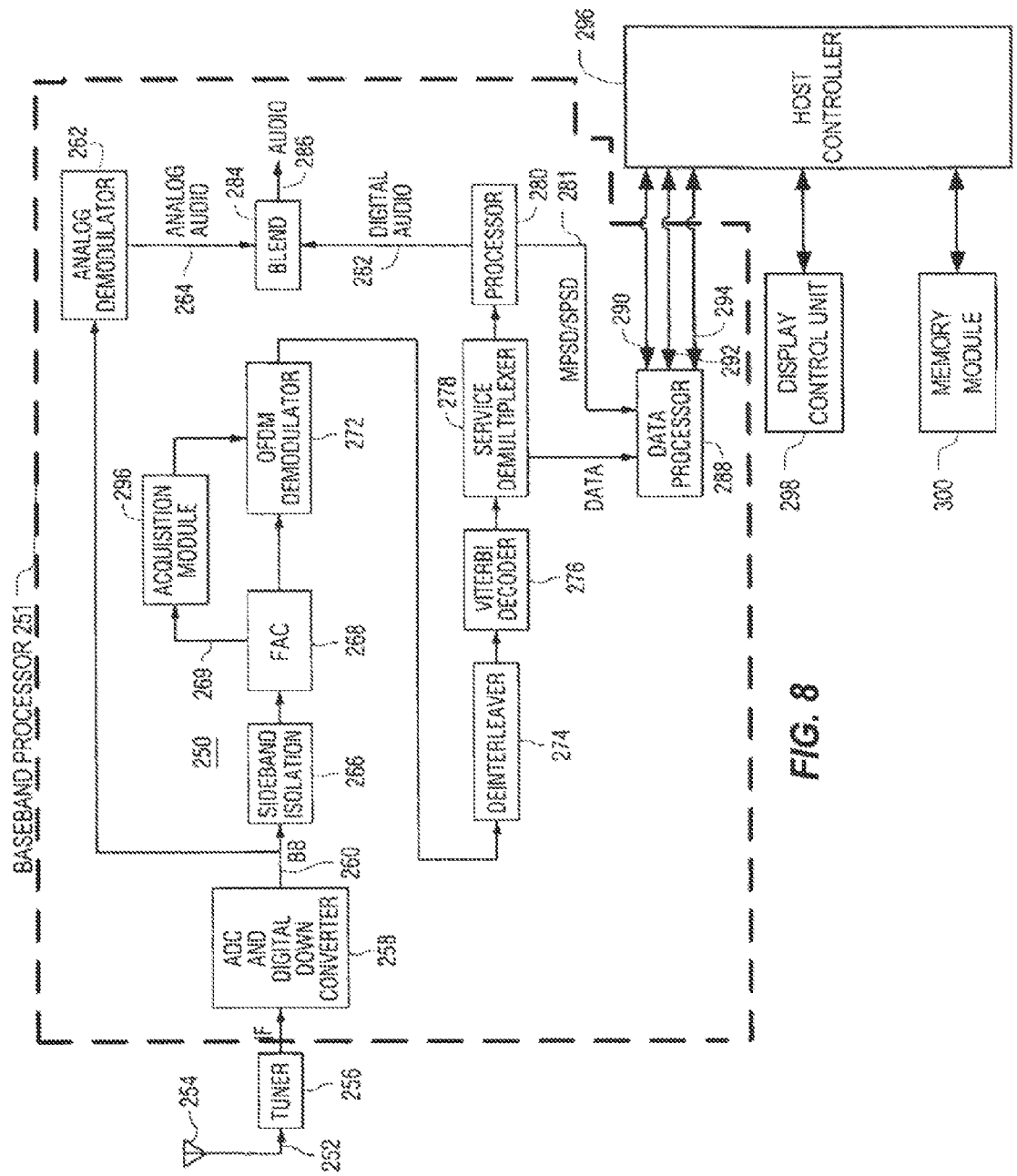
FIG. 8 is a functional block diagram of an FM IBOC digital radio broadcasting receiver in accordance with certain embodiments.
Figure 18:
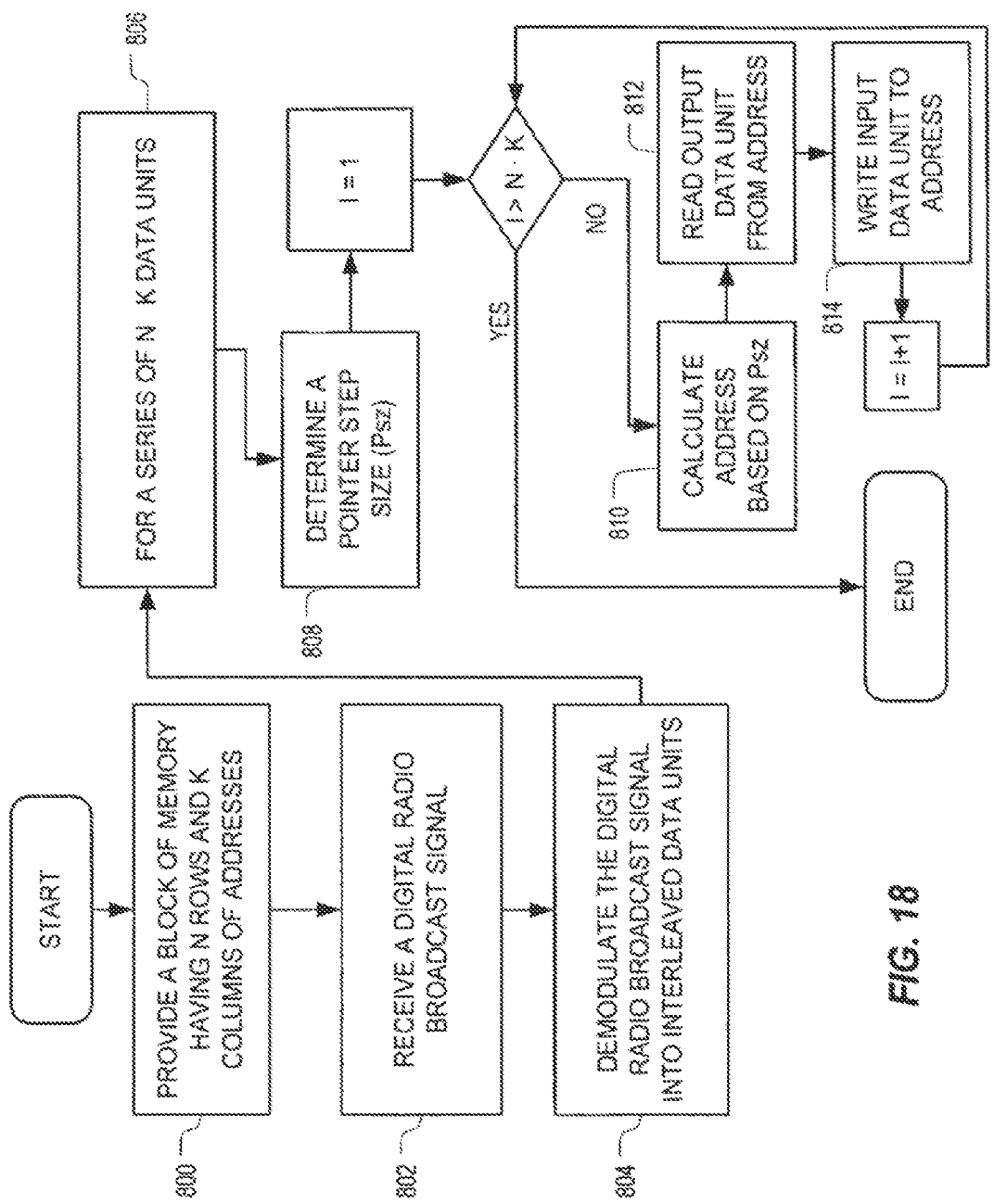
FIG. 18 illustrates an exemplary technique for block deinterleaving data received at a digital radio broadcast receiver in accordance with certain embodiments.

FIG. 18 shows an exemplary technique of deinterleaving data received at a digital radio broadcast receiver in accordance with certain embodiments. The components of the exemplary receivers shown in FIGS. 7 and 8 are used for illustrative purposes. First, in step 800 the baseband processor 201, 251 provides a block of memory having n×k addresses (shown for exemplary purposes as n=11 rows by k=7 columns in FIGS. 19-21), wherein the block comprises a single table. The block of memory may be a single block of memory. The block of memory is allocated to the deinterleaver function 218, 274. As would be appreciated by one of skill in the art, the block of memory need not be consecutive memory addresses as long as sufficient memory is allocated. For example, two blocks of memory could be used, each containing, for example, n·k/2 addresses.

Next, in step 802, the receiver receives a digital radio broadcast signal. The demodulator 216, 272 then demodulates the digital radio broadcast signal into a plurality of data units in step 804, which were interleaved at the transmit side. While only demodulation is described for exemplary purposes, one of skill in the art would understand that additional processing is also typically performed as described above. It is noted that although these data units may be stored in a buffer, queue, stack or any other suitable structure that is accessible by the deinterleaver 218, 274, such storage could require additional receiver memory and, in certain embodiments, is not required for the new approach to block deinterleaving described herein.

Next, in step 806, for each series of n×k data units (i.e., one complete cycle of read/write operations in the amount of n×k) from the plurality of interleaved data units, the deinterleaver 218, 274 performs the following operations. First, the deinterleaver determines a calculation support variable referred to herein as a pointer step size (Psz) in step 808. The pointer step size (Psz) can be set for the first series of n×k data units as $Psz_{(1)}=1$. For every series thereafter, calculate Psz, before starting the series, as follows:

$$P_{temp} = \mathrm{MOD}(Psz_{(m-1)} \cdot k, (n \cdot k)) + \lfloor Psz_{(m-1)}/(n) \rfloor; \text{ and then}$$

$$Psz_{(m)} = \mathrm{MOD}(P_{temp}, (n \cdot k)) + \lfloor P_{temp}/(n \cdot k) \rfloor,$$

where m is an index corresponding to a given set of n×k data units and $P_{temp}$ is a temporary step size variable based on iteration m−1 for use in determining the step size $Psz_{(m)}$ for iteration m.

Next, FIG. 18 illustrates a loop of operations that are performed for each data unit i from 1 to n×k. For each data unit in the series, the deinterleaver 218, 274 calculates a memory address (ADDRp) in the block based on the pointer step size in step 810. The receiver table may be viewed as one single dimension memory array, and accessing the memory can be done by a single address pointer. Thus, for the exemplary 11 by 7 tables shown in FIGS. 19-21, the address pointers start with address pointer number 1 at the top left, and then run through various columns and rows all the way to address pointer number 77 at the bottom right. The address (ADDRp) can be calculated as follows, for $i=1, \mathrm{ADDR}p(1)=1$  i.

for $i \in [2,(n \cdot k-1)], \mathrm{ADDR}p(i) = \mathrm{MOD}((\mathrm{ADDR}p(i-1) + Psz),(n \cdot k)) + \lfloor (\mathrm{ADDR}p(i-1)+Psz)/(n \cdot k) \rfloor$  ii.

for $i=n \cdot k, \mathrm{ADDR}p(n \cdot k)=n \cdot k$  iii.

Next, the deinterleaver 218, 274 reads an output data unit from the block at the address in step 812. The data stored at this address is output to the decoder 220, 276 for further processing. This data can be output to the decoder in any suitable manner, such as, for example, by pushing the data onto a stack, queue, or buffer, or by the decoder directly retrieving the data from the deinterleaver table. It is noted that although these data units may be stored in a buffer, queue, stack or any other suitable structure that is accessible by the deinterleaver 218, 274, such storage could require additional receiver memory and, in certain embodiments, is not required for the new approach to block deinterleaving described herein. Finally, in step 814 the deinterleaver 218, 274 writes an input data unit from the plurality of interleaved data units to the block at the address. Note that "output" and "input" are merely used as convenient adjectives for describing the distinction between data units read out from the memory block and data units written into the memory block, and are not intended to be limiting in any way.

As a result of these operations, the deinterleaver 218, 274 outputs deinterleaved data units to the decoder. It should also be noted that the input data units stored in the deinterleaver table are not necessarily sequentially ordered in the block of memory, as opposed to conventional deinterleavers (e.g., FIG. 16) where the data units in the receiver read table are sequentially stored.

It will be appreciated from the foregoing that once a first series of data units has been fully written to the table, data units from a second series of data units are being written over data units from the first series at the same time as the first series is being read. Thus, at various points in time the table will contain data from both the first series and the second series simultaneously. Therefore, the technique utilizes a single table that preserves data not yet read from the first series, while overwriting data units from the first series that have been read with data units from a second series. In other words, the deinterleaver reads the output data units from the block for a first series and writes the input data units to the block for the next series of data units, such that writing some of the input data units to the block for the next series is performed before reading the output data units from the block for the first series is completed. To accomplish this, the algorithm described above updates the address pointer so that the reading and writing operations from and to the table are done in a non-sequential manner, while using one address for each set of a single read and a single write operation, i.e., from and to non-sequential addresses.

FIGS. 19-21 illustrate exemplary data for read and write operations in a single deinterleaver table in accordance with certain embodiments. The exemplary data is described from an early read stage, where no valid data is available through a completion of one interleaver cycle and starting the next cycle. FIG. 19 shows a deinterleaver table after filling an initial 76 data units of meaningless data. FIG. 20 shows the deinterleaver table after filling the first 150 data units (77 of which are meaningless data). FIG. 20 and FIG. 22 clearly illustrate that the data stored in the table is non-sequential. As described above, the pointer step size is initially 1. Thus, based on the equations described above to determine the address, the sequence of the initial data written to the table is the same as the interleaved sequence of transmitted data units shown in FIG. 17. FIG. 21 shows the deinterleaver table after filling 207 data units in accordance with the equations described above.

Figure 22A:
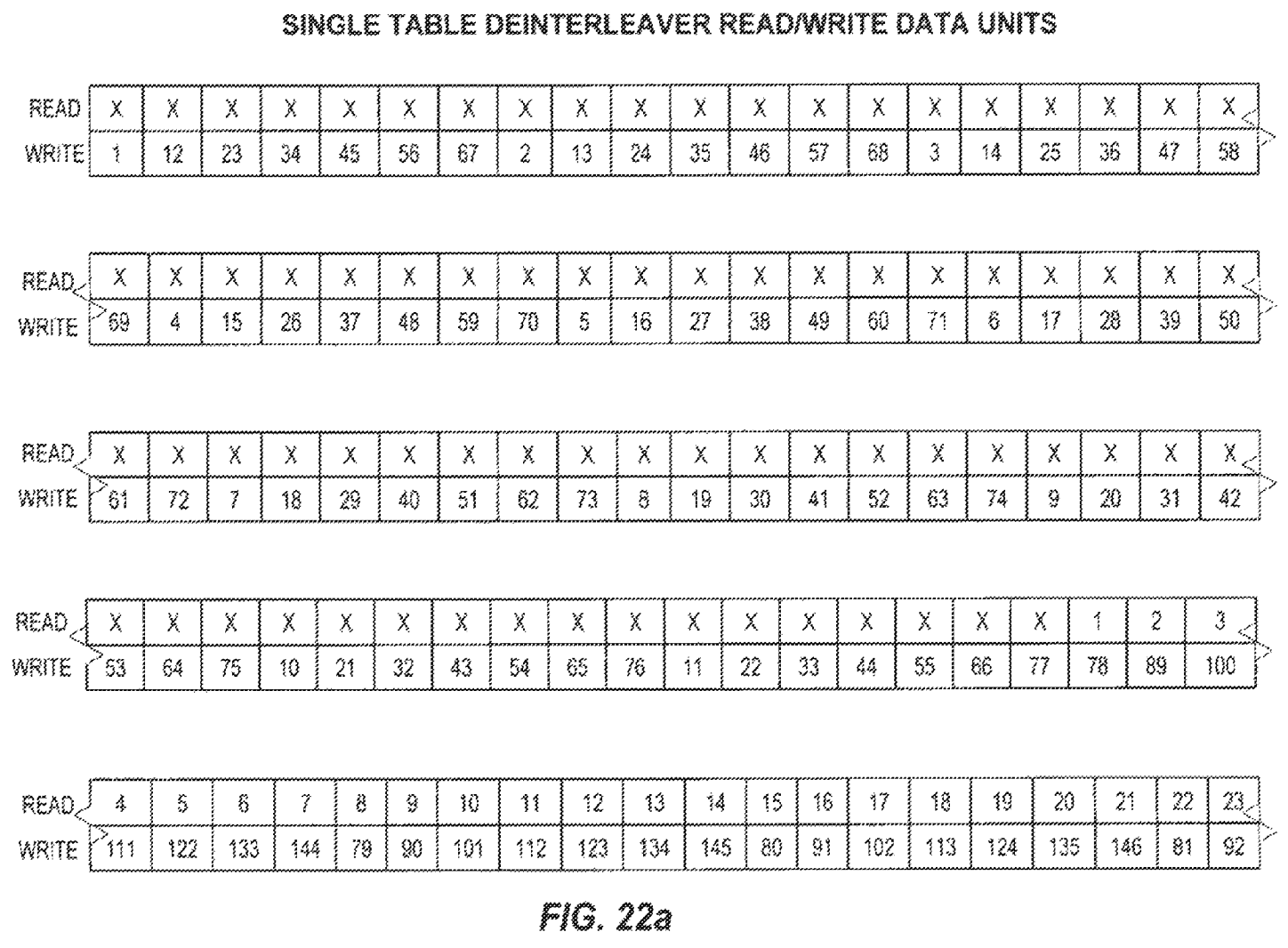

FIGS. 22a and 22b illustrate exemplary single table deinterleaver read and write operations beginning with receiving the first meaningful data unit at the receiver. Note that in accordance with the equations described above, the initial sequence of write operations is the same as the interleaved sequence of transmitted data units shown in FIG. 17. However, after the first 77 meaningful data units have been stored, the algorithms described above result in the data being read out of the deinterleaver table sequentially.

Referring to FIG. 22a, the equations described above will be used to show how the first and second data units are sequentially read out of the deinterleaver table into the decoder. Before starting the second series of n×k (11×7=77 in this example) data units, the pointer step size (Psz) is calculated as Psz=mod(1·7, 77)+floor(1/11)=7. Then Psz=mod(7, 77)+floor(7/77)=7. According to the equations, the first address pointer ADDRp=1. As shown in FIG. 20, data unit 1 is located at address number 1. As shown in FIG. 22a, data unit 1 is the first meaningful data unit read (after the sequence of 77 X's), and then data unit 78 is written over data unit 1. The second address pointer, based on the equations is ADDRp=mod((1+7),77)+floor(1+7/77)=8. As shown in FIG. 20, data unit 2 is located at address number 8. From FIG. 22a, data unit 2 is the next data unit read, and then data unit 89 is written over data unit 2.

The following examples illustrate how memory usage can be affected by implementing a single table deinterleaver as described above. Such a configuration may be implemented on a reduced cost ASIC (or MCCP). The design may benefit from very low power consumption when implemented in ASIC and using SRAM.

Figure 23:
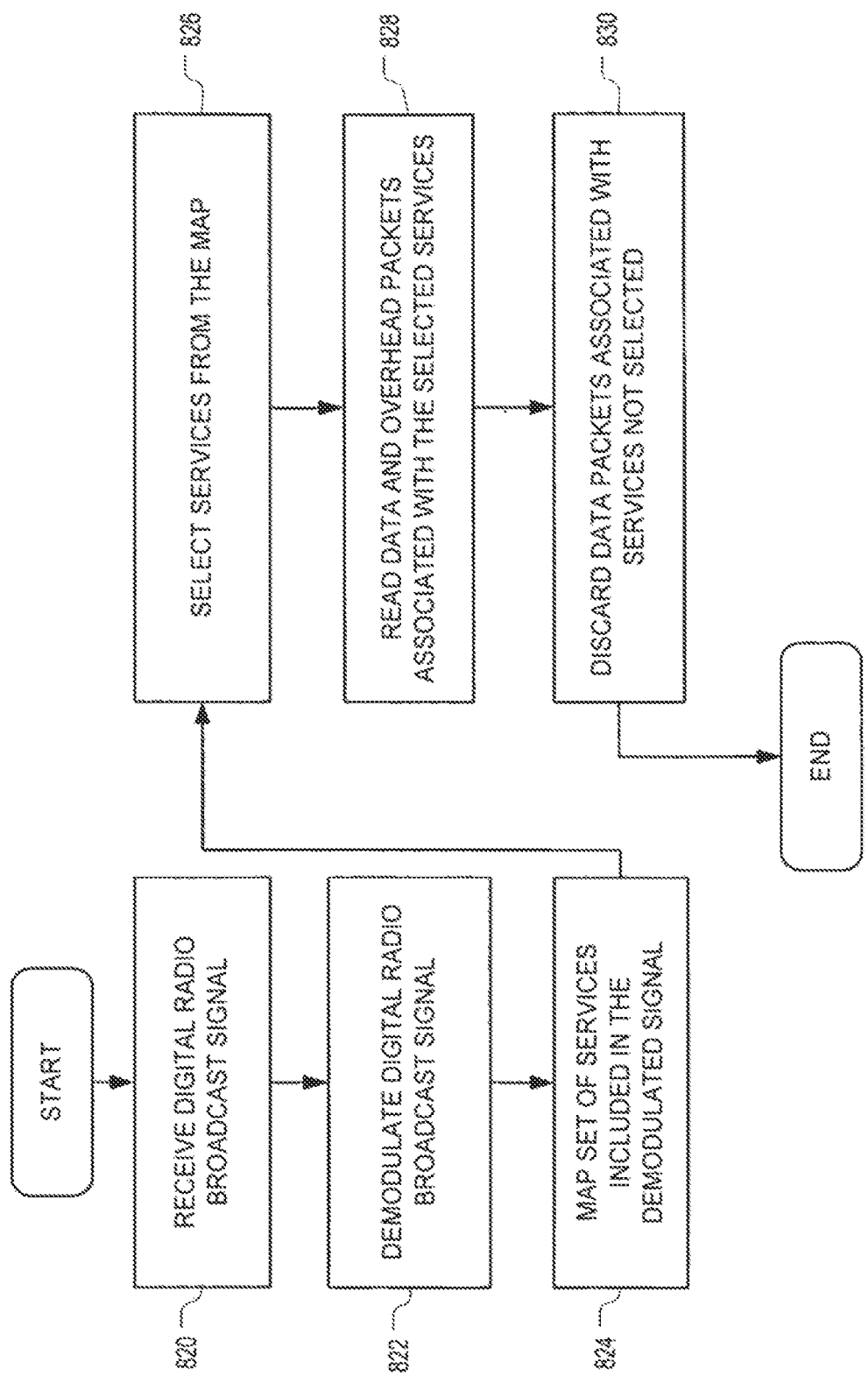
FIG. 23 illustrates an exemplary technique of reducing power usage of a digital radio broadcast receiver in accordance with certain embodiments.
Figure 24:
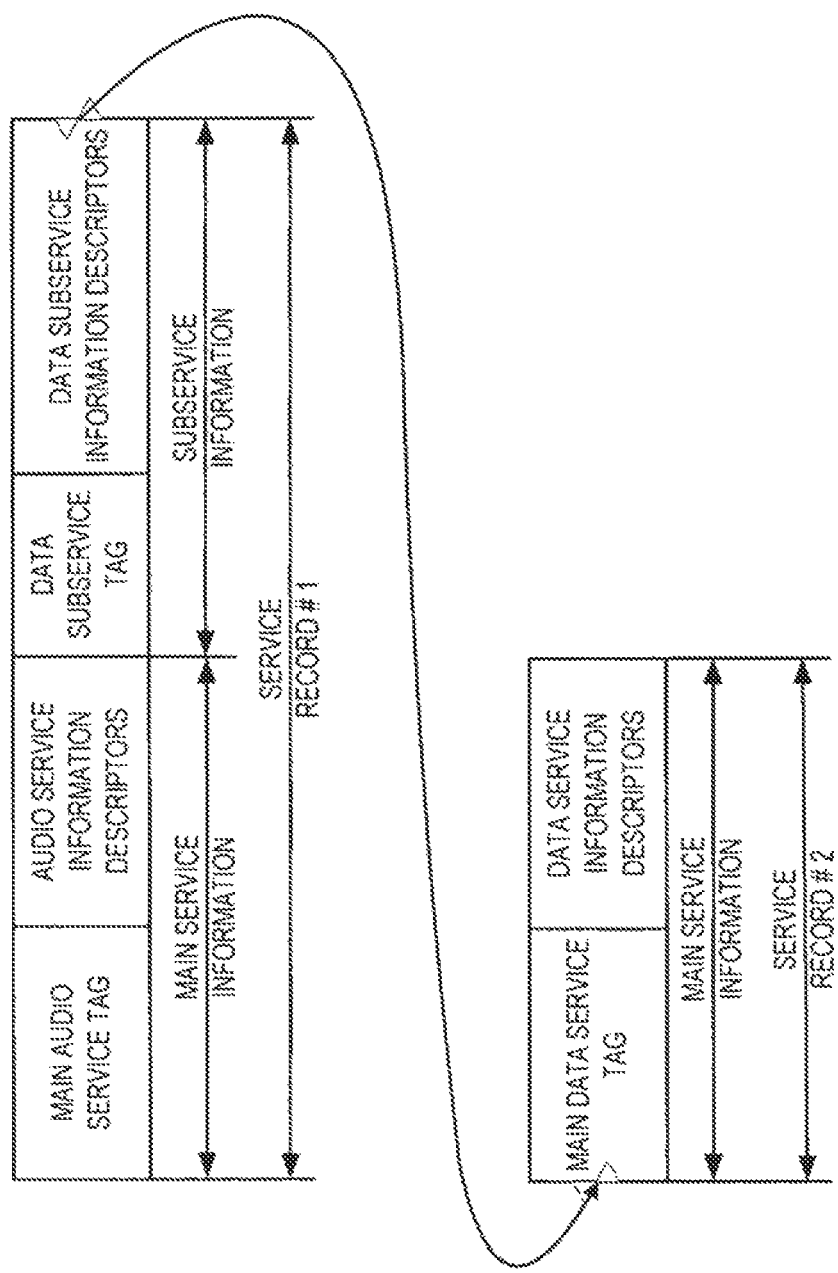
FIG. 24 illustrates an exemplary data control service in accordance with certain embodiments.

In accordance with another exemplary embodiment, a description of novel techniques of reducing processor usage in a digital radio broadcast receiver will now be provided with reference to FIGS. 23 and 24. Typical receiver implementations employ complete processing of L1 (the physical layer) regardless of the actual content and bit rate of the data used by the receiver. However, receivers in accordance with exemplary embodiments can reduce processor usage by processing only content that is actually being rendered.

FIG. 23 illustrates an exemplary process for reducing power usage of a digital radio broadcast receiver in accordance with certain embodiments. The components of the exemplary receivers shown in FIGS. 7 and 8 are used for illustrative purposes. First, in step 820, the receiver receives a digital radio broadcast signal. Next, in step 822 the receiver demodulates the digital radio broadcast signal. While only demodulation is described for exemplary purposes, one of skill in the art would understand that additional processing is also typically performed as described above. In step 824, after the digital radio broadcast signal is demodulated, the baseband processor 201, 251 maps the set of services that are included in the demodulated signal. These services may include audio services, data services, or any combination thereof. This step typically involves initially decoding program headers from all logical channels and generating a data structure (e.g., a table) including the available services.

Next, in step 826 the receiver and/or a user selects services from the map of available services. In typical implementations, the user is presented with a man-machine interface (MMI) that allows the user to select desired services from the available services. In certain embodiments, the receiver may determine that it lacks the memory and/or processing capability to deinterleave and/or decode a particular data service. In these embodiments, the MMI may prevent selection of the data services that should not be deinterleaved or decoded, or render an error message if such services are selected, e.g., due to limited memory, limited power (such as a low battery level in a portable device), etc. or a combination of such factors. In addition, it may be desirable in certain embodiments for the receiver to automatically select services based on predetermined factory or user settings. For example, a processor such as baseband processor 201, 251 can possess functionality to make a determination of whether the receiver has the capability to store data packets of various services for later processing, e.g., sufficient memory and processing resources are expected to be available for carrying out such later processing. For example, sufficient memory resources may presently exist while sufficient processing resources do not presently exist, but are expected to be available later. The choice of suitable approaches for determining current states of processing and memory resources and for assessing processing and memory requirements for additional operations are within the purview of those of ordinary skill in the art. If such capability exists, the data packets for such services can be stored for later processing. On the other hand, the processor such as baseband processor 201, 251 can prevent selection of services for which the digital broadcast receiver does not have the capability to store data packets for later processing.

It is within the purview of receiver designers of ordinary skill to determine appropriate rule sets for deciding the priority of which services can be processed based on power and memory resources. For example, a suitable rule set might give the services presently in use the highest priority, while other services would receive lower priorities based on the receiver platform (e.g., portable, car receiver, or tabletop receiver), customer settings, factory settings, and/or other implementation factors.

In step 828, the decoder 220, 276 reads from the deinterleaver 218, 274 data and overhead packets associated with the selected services.

Finally, in step 830, the baseband processor 201, 251 discards data packets that are associated with services that were not selected. This may be done, for example, by reading out packets associated with unselected services (i.e., services that were not selected by either the receiver and/or the user as explained above) from the deinterleaver 218, 274 and then deleting the data prior to decoding, or it may be done by not reading unselected service data from the deinterleaver at all. In typical implementations, only certain overhead packets associated with unselected data services are still read out and processed to facilitate boundary tracking of all the available services.

Reducing data exchange and processing may be performed using the following three steps: (a) Define the logical channel and PDU size of the service in use; (b) Read only data from the deinterleaver associated with the program in use and the required overhead; and (c) Decode (Viterbi decoder) only data as read in (b) above and the required overhead.

Defining the logical channel of the program in use typically involves initially decoding program headers from all logical channels and mapping the services. The exception to this requirement is MPS (Main Program Service, also referred to as 'HD1'), which is always in the first PDU in P1. However, as indicated in the program headers, any program including MPS may consist of more than one stream. In such cases, audio headers from PDUs in additional logical channels need to be decoded and mapped. However, as one of skill in the art would understand, the decoding and mapping need not be done all at once—it may be done over time at the cost of delay in reaching to the full provided audio quality. For example, the program in use might simply be HD1 of a given frequency, i.e., audio that is being rendered to the user, which is easily determined since the receiver is tuned to that HD1 service. Thus, the logical channel in use can be readily defined in this instance and additional decoding and mapping of headers can be delayed.

Reading only data from the interleaver associated with the program in use and the required overhead involves determining the boundaries of the current audio service PDU and retrieving only the PDUs associated with that service. In contrast, typical receivers simultaneously demodulate and process, whether in full or in part, all compressed audio PDUs for all the present programs. When the audio service location, for specific services other than MPS, is indicated by the broadcasting system, the receiver may demodulate and process L2 PDU and L4 PDU only from the relevant channel, without the need for a discovery process. The receiver can further reduce processing and memory by additionally reducing processing of portions of L1. In addition, the receiver may expedite content availability due to processing a lesser amount of data. Similarly, decoding only the data associated with the service in use and necessary overhead will also reduce processor usage.

Due to the variable compression rates typically present in digital radio broadcasts, audio PDU size may vary, and the variations may be large. Thus, as long as L2 (layer 2) indicates the presence of audio content in a transfer frame, it is preferable to continuously track all audio headers so that accurate PDU boundaries can be maintained. The number of audio headers to track will depend on the logical channel of the desired audio service's PDUs. For example, tracking audio headers when using HD4, while all programs are in P1, may require tracking only 3 additional headers. Tracking the MPS's PDUs would typically not require tracking any additional headers.

The payload data that is read from the deinterleaver to render an audio service is approximately the size of the audio PDUs of the current service. This data should be read in whole, exactly as indicated by the locators. In addition, overhead data is also read to maintain tracking of the desired PDUs. The amount of overhead data read is an implementation decision that is proportional to the need for tracking other service's audio headers. The overhead data that is required by the Viterbi decoder is proportional to the audio headers being tracked, including the header of the program in use.

Exemplary overhead data may include the following:

a) Between 180 bits (9*8*2.5) and 1920 bits (96*8*2.5) per redundant audio header. The actual amount depends on whether audio headers are intended to be fully decoded (corrected) using Reed-Solomon code, or whether only the last locator is expected to be read. The amount also depends on the logical channel and the redundant audio program codec mode.

b) Up to 2.5*(K+Tb) bits per tracked audio PDU header, where K denotes the constraint length and Tb represents implementation specific Viterbi decoder trace back length. For a maximum K+Tb amount up to 128 bits, the overhead per tracked header may be up to 320 bits.

Based on the foregoing, the following two examples show exemplary savings that can be achieved in accordance with certain embodiments of the present disclosure.

First, consider the case where 2 audio services are broadcast on a logical channel and the PDUs from both audio services are fully processed. Assume that each service is allocated 48 kbps over the channel, and HD2 (Supplementary Program Service 1, also referred to as SPS1) is in use. In this case, the overhead read/decode operations could be 1,920 bits for redundant audio headers plus 640 for K+Tb for 2 programs. Thus the required operations would be on the order of 365,440/2=182720 total operations.

However, if the PDUs for the unused audio services were not processed (i.e., discarded), then total operations would be substantially reduced. In this example, the total operations would be 182,720−1,920−640=180,160. Therefore, the relative amount of deinterleaver read and Viterbi decode processes that are saved using this method is 180,160/365,440=0.493. This is a total saving of approximately 49%, which may translate into a similar quantity of power savings.

Next, consider a case where 4 audio programs are broadcast on P1, including MPS at 32 kbps and the three other programs at 20 kbps each. Assume that HD4 is currently in use. In this case, the overhead read/decode operations could be 5,760 for 3 redundant headers and 1,280 for K+Tb for 4 programs. Thus, if the unused audio services were discarded, the required operations would on the order of 20/97*365,440, or approximately 75,350 operations. This translates into a reduction of operations of 365,440−75,350−5,760−1,280)=283,050. Therefore, the relative amount of deinterleaver read and Viterbi decode processes saved in this method are 283,050/365,440=0.774. This is a total saving of approximately 77%, which may translate into a similar quantity of power savings.

Calculating the deinterleaver read locations can be performed in accordance with the single table deinterleaver technique described above. In addition, for MPS, the first calculated read address is also the first location of the first header bit. For other SPSs, the first header bit is the 'last locator' value (indicated in the audio header) of the previous program, shifted (add) by 8 bits.

Referring now to reducing processor usage for data services, for a digital broadcast radio receiver to increase efficiency of power and memory management, it can be desirable to provide the receiver with additional information regarding data content flow. Many relevant details are known to the broadcasting system directly from the service contract or can be derived from follow-up calculations and configuration. Such information may be conveyed to the receiver, and used to carry out the exemplary method shown in FIG. 23. This information can include:

i) Data service delivery channel and sub-channel;

ii) Data service quality of service (QoS), in terms of coding rate and interleaver depth;

iii) Data service packet length limit (not instantaneous length); and iv) Data service availability time (start, end).

The information described above can be included in the SIG (Service Information Guide). For example, an exemplary SIG message is illustrated in FIG. 24. The example in FIG. 24 includes two concatenated service records, Service Record #1 and Service Record #2. Service Record #1 describes an audio service (e.g., MPS) and an associated data service. Service Record #1 includes a main audio service and a single associated data service, indicated by the main and subservice tags. The main service is an audio service and includes audio service information descriptors. The subservice is an associated data service (e.g., album art or closed captioning information) and includes data service information descriptors. Likewise, Service Record #2 describes only a main data service (e.g., stock ticker or weather information). Service Record #2 includes a main data service tag and data service information descriptors.

The additional information can be included in the information descriptors. Exemplary information descriptors that can be used in certain exemplary embodiments includes the following.

Number of Links. This is the number of indicated delivery links for the component. For example, certain services may be delivered in a distributed way over more than one link.

Locator. This indicates the logical channels and sub-channels (data only) over which the service component is delivered. When the service location of a data service is indicated by the broadcasting system, the receiver may process only the indicated sub-channel, which may allow for noticeable reduction in processing and avoiding significant waste of memory. It may also allow for faster availability of the desired service.

Capsule. This indicates the limit of the allocated (not instantaneous, which often may be smaller) service component transport layer encapsulation. For data, the specific limit depends on the combination of channel, sub-channel, nature of contracted service, and whether the bearer channel is fixed or opportunistic.

Packet length limit. When aggregating data service fragments for a given service, the receiver has to allocate memory in the amount of expected packet length. Without specific length information, the receiver may either allocate memory for the longest expected packet length or start from relatively small allocation and incrementally increase that allocation until the entire packet is aggregated. The first option is wasteful in terms of memory and may result in rapidly arriving at a memory limit, thus restricting the ability to add more services. The second option may be efficient in terms of memory, but may result in fragmented memory, more operations and having to repeat the process from one packet to another, even for the same service. When a packet length limit is provided for a specific service, the receiver can allocate memory in the exact required amount, thus avoiding waste, fragmentation, and extra operations. This can provide the capacity to add more data services. The indicated information also allows the receiver to manage service priorities, based on required and available memory, or other processing considerations.

The exemplary approaches described may be carried out using any suitable combinations of software, firmware and hardware and are not limited to any particular combinations of such. Computer program instructions for implementing the exemplary approaches described herein may be embodied on a tangible, non-transitory, computer-readable storage medium, such as a magnetic disk or other magnetic memory, an optical disk (e.g., DVD) or other optical memory, RAM, ROM, or any other suitable memory such as Flash memory, memory cards, etc.

Additionally, the disclosure has been described with reference to particular embodiments. However, it will be readily apparent to those skilled in the art that it is possible to embody the disclosure in specific forms other than those of the embodiments described above. The embodiments are merely illustrative and should not be considered restrictive. The scope of the disclosure is given by the appended claims, rather than the preceding description, and all variations and equivalents which fall within the range of the claims are intended to be embraced therein.

What is claimed is:

1. A processor-implemented method of block deinterleaving data received at a digital radio broadcast receiver comprising:

a. providing a block of memory having n×k addresses, wherein the block comprises a single table, and each of n and k is a non-zero, positive integer;

b. receiving a digital radio broadcast signal at the digital radio broadcast receiver;

c. demodulating the digital radio broadcast signal into a plurality of interleaved data units;

d. for a current series of n×k interleaved data units, i. calculating a pointer step size according to size of the current series of interleaved data units and a pointer step size of a previous series of interleaved data units; and ii. for each interleaved data unit in the current series, 1. calculating an address in the block based on the pointer step size;

2. reading an output data unit from the block at the calculated address, such that said output data units represent block deinterleaved data units; and 3. writing an input data unit from the plurality of interleaved data units to the block at the same calculated address prior to reading and writing a subsequent output data unit.

2. The processor-implemented method of claim 1 wherein said input data units are not sequentially ordered in the block of memory.

3. The processor-implemented method of claim 1 wherein the pointer step size Psz is determined as follows:

a. $P_{temp} = MOD(Psz_{(m-1)} \cdot k, (n \cdot k)) + \lfloor Psz_{(m-1)}/(n) \rfloor$; and b. $Psz_{(m)} = MOD(P_{temp}, (n \cdot k)) + \lfloor P_{temp}/(n \cdot k) \rfloor$, where m is an index corresponding to a given set of n×k data units and $P_{temp}$ is a temporary step size variable.

4. The processor-implemented method of claim 3, wherein for a first iteration of deinterleaving, the pointer step size is set to $Psz_{(1)}=1$.

5. The processor-implemented method of claim 3 wherein each address in the block is calculated as follows:

a. For i from 1 to n×k, the address (ADDRp) is as follows, i. for $i=1$, $ADDRp(1)=1$;

ii. for $i \in [2,(n \cdot k-1)]$, $ADDRp(i)=MOD((ADDRp(i-1)+Psz),(n \cdot k)) \pm \lfloor (ADDRp(i-1) \pm Psz)/(n \cdot k) \rfloor$;

iii. for $i=n \cdot k$, $ADDRp(n \cdot k)=n \cdot k$.

6. The processor-implemented method of claim 1 wherein the interleaved data units are bits.

7. The processor-implemented method of claim 1 comprising:
reading the output data units from the block for a first series and writing the input data units to the block for a next series interleaved of data units, such that writing some of the input data units to the block for the next series is performed before reading the output data units from the block for the first series is completed,
wherein reading and writing from and to the block are done from and to non-sequential addresses.

8. The processor-implemented method of claim 1, wherein
the reading of the output data unit comprises a read operation,
the writing of the input data unit comprises a write operation performed after the read operation, and
the read operation and the mite operation are consecutive operations.

9. The processor-implemented method of claim 8, wherein the read operation and the write operation are performed using a single address pointer.

10. A digital radio broadcast receiver configured to perform block deinterleaving of data comprising:
a processing system; and
a memory coupled to the processing system, wherein the processing system is configured to execute steps comprising:
a. providing a block of memory having n×k addresses, wherein the block comprises a single table, and each of n and k is a non-zero, positive integer;
b. receiving a digital radio broadcast signal at the digital radio broadcast receiver;
c. demodulating the digital radio broadcast signal into a plurality of interleaved data units;
d. for a series of n×k interleaved data units,
  i. calculating a pointer step size according to size of the series of interleaved data units and a pointer step size of a previous series of interleaved data units; and
  ii. for each interleaved data unit,
    1. calculating an address in the block based on the pointer step size;
    2. reading an output data unit from a first series of data units from the block at the address, such that said output data units represent block deinterleaved data units; and
    3. writing an input data unit from a second series of interleaved data units to the block at the same address prior to reading and writing another output data unit.

11. The digital radio broadcast receiver of claim 10 wherein said input data units are not sequentially ordered in the block of memory.

12. The digital radio broadcast receiver of claim 10 wherein the pointer step size Psz is determined as follows:

$P_{temp} = MOD(Psz_{(m-1)} \cdot k, (n \cdot k)) + \lfloor Psz_{(m-1)}/(n) \rfloor$; and   a.

$Psz_{(m)} = MOD(P_{temp}, (n \cdot k)) + \lfloor P_{temp}/(n \cdot k) \rfloor$,   b.

where in is an index corresponding to a given set of n×k interleaved data units and $P_{temp}$ is a temporary step size variable.

13. The digital radio broadcast receiver of claim 12, wherein for a first iteration of deinterleaving, the pointer step size is set to $Psz_{(1)}=1$.

14. The digital radio broadcast receiver of claim 12 wherein each address in the block is calculated as follows:

a. For i from 1 to n×k, the address (ADDRp) is as follows, for $i=1, ADDRp(1)=1$;   i.

for $i \in [2, (n \cdot k-1)], ADDRp(i) = MOD((ADDRp(i-1) + Psz), (n \cdot k)) + \lfloor (ADDRp(i-1)+Psz)/(n \cdot k) \rfloor$,   ii.

for $i = n \cdot k, ADDRp(n \cdot k) = n \cdot k$   iii.

15. The digital radio broadcast receiver of claim 10 wherein the interleaved data units are bits.

16. The digital radio broadcast receiver of claim 10 comprising:
reading the output data units from the block for a first series and writing the input data units to the block for a next series of interleaved data units, such that writing some of the input data units to the block for the next series is performed before reading the output data units from the block for the first series is completed,
wherein reading and writing from and to the block are done from and to non-sequential addresses.

17. The digital radio broadcast receiver of claim 10, wherein the reading of the output data unit comprises a read operation,
the writing of the input data unit comprises a write operation performed after the read operation, and
the read operation and the write operation are consecutive operations.

18. The digital radio broadcast receiver of claim 17, wherein the read operation and the write operation are performed using a single address pointer.

19. An article of manufacture comprising a non-transitory computer readable storage medium having computer program instructions adapted to cause a processing system to execute steps comprising:
a. providing a block of memory having n×k addresses, wherein the block comprises a single table, and each of n and k is a non-zero, positive integer;
b. receiving a digital radio broadcast signal at the digital radio broadcast receiver;
c. demodulating the digital radio broadcast signal into a plurality of interleaved data units;
d. for a current series of n×k interleaved data units,
  i. calculating a pointer step size according to size of the current series of interleaved data units and a pointer step size of a previous series of interleaved data units; and
  ii. for each interleaved data unit in the series,
    1. calculating an address in the block based on the pointer step size;
    2. reading an output data unit from the block at the calculated address, such that said output data units represent block deinterleaved data units; and
    3. writing an input data unit from the plurality of interleaved data units to the block at the same calculated address prior to reading and writing a subsequent output data unit.

20. The article of manufacture of claim 19 wherein said input data units are not sequentially ordered in the block of memory.

21. The article of manufacture of claim 19 wherein the pointer step size is determined as follows:

$P_{temp} = MOD(Psz_{(m-1)} \cdot k, (n \cdot k)) + \lfloor Psz_{(m-1)}/(n) \rfloor$, and   a.

$Psz_{(m)} = MOD(P_{temp}, (n \cdot k)) + \lfloor P_{temp}/(n \cdot k) \rfloor$,   b.

where m is an index corresponding to a given set of n×k interleaved data units and $P_{temp}$ is a temporary step size variable.

22. The article of manufacture of claim 21, wherein for a first iteration of deinterleaving, the pointer step size is set to $Psz_{(1)}=1$.

23. The article of manufacture of claim 21 wherein each address in the block is calculated as follows:
a. For i from 1 to n×k, the address (ADDRp) is as follows, i. for $i=1, ADDRp(1)=1$;

ii. for $i \in [2,(n \cdot k-1)]$, $ADDRp(i)=MOD((ADDRp(i-1)+Psz),(n \cdot k))+\lfloor(ADDRp(i-1)+Psz)/(n \cdot k)\rfloor$;

iii. for $i=n \cdot k, ADDRp(n \cdot k)=n \cdot k$.

24. The article of manufacture of claim 19 wherein the interleaved data units are bits.

25. The article of manufacture of claim 19 comprising:
reading the output data units from the block for a first series and writing the input data units to the block for a next series of interleaved data units, such that writing some of the input data units to the block for the next series is performed before reading the output data units from the block for the first series is completed,
wherein reading and writing from and to the block are done from and to non-sequential addresses.

26. The article of manufacture of claim 19, wherein
the reading of the output data unit comprises a read operation,
the writing of the input data unit comprises a write operation performed after the read operation, and
the read operation and the write operation are consecutive operations.

27. The article of manufacture of claim 26, wherein the read operation and the write operation are performed using a single address pointer.

* * * * *

UNITED STATES PATENT AND TRADEMARK OFFICE
CERTIFICATE OF CORRECTION

PATENT NO. : 9,842,048 B2
APPLICATION NO. : 14/939863
DATED : December 12, 2017
INVENTOR(S) : Marek Milbar It is certified that error appears in the above-identified patent and that said Letters Patent is hereby corrected as shown below:

On the Title Page

In item (73), in "Assignee", in Column 1, Line 1, delete "Ibiquity" and insert --iBiquity-- therefor In item (57), in "Abstract", in Column 2, Line 3, after "having", delete "a"

On page 2, in Column 2, under "Other Publications", Line 11, delete "Jun. 20," and insert --Jun. 10,-- therefor In the Claims In Column 22, Line 52, in Claim 3, before "data", insert --interleaved--

In Column 23, Line 5, in Claim 7, delete "interleaved of" and insert --of interleaved-- therefor In Column 23, Line 17, in Claim 8, delete "mite" and insert --write-- therefor In Column 23, Line 60, in Claim 12, delete "in" and insert --m-- therefor In Column 25, Line 13, in Claim 24, delete "article:" and insert --article-- therefor Signed and Sealed this
Twenty-eighth Day of May, 2019

Andrei Iancu
*Director of the United States Patent and Trademark Office*

UNITED STATES PATENT AND TRADEMARK OFFICE
CERTIFICATE OF CORRECTION

PATENT NO. : 9,842,048 B2
APPLICATION NO. : 14/939863
DATED : December 12, 2017
INVENTOR(S) : Marek Milbar Page 1 of 1

It is certified that error appears in the above-identified patent and that said Letters Patent is hereby corrected as shown below:

In the Claims

Column 22, Lines 62-63, Claim 5, delete "for $i \in [2,(n \cdot k-1)], ADDR_P(i)=MOD((ADDR_P(i-1)+Psz),(n \cdot k)) \pm \lfloor (ADDR_P(i-1) \pm Psz)/(n \cdot k) \rfloor;$ " and insert --for $i \in [2,(n \cdot k-1)], ADDR_P(i)=MOD((ADDR_P(i-1)+Psz),(n \cdot k))+\lfloor (ADDR_P(i-1)+Psz)/(n \cdot k) \rfloor;$ -- therefor Column 24, Line 62, Claim 21, delete "$P_{temp}=MOD(Psz_{(m-1)} \cdot k,(n \cdot k))+\lfloor (Psz_{(m-1)}/(n) \rfloor$, and" and insert --$P_{temp}=MOD(Psz_{(m-1)} \cdot k,(n \cdot k))+\lfloor (Psz_{(m-1)}/(n) \rfloor;$ and-- therefor Signed and Sealed this
Twenty-eighth Day of April, 2020

Andrei Iancu
*Director of the United States Patent and Trademark Office*